US012721114B2

(12) United States Patent
Liu et al.

(10) Patent No.: US 12,721,114 B2
(45) Date of Patent: Aug. 25, 2026

(54) METHOD FOR PROCESSING A SUBSTRATE

(71) Applicant: Tokyo Electron Limited, Tokyo (JP)

(72) Inventors: Eric Chih-Fang Liu, Albany, NY (US); Sophie Thibaut, Albany, NY (US); Nicholas Joy, Albany, NY (US); Christopher Cole, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 444 days.

(21) Appl. No.: 18/461,218

(22) Filed: Sep. 5, 2023

(65) Prior Publication Data

US 2025/0079174 A1 Mar. 6, 2025

(51) Int. Cl.
*H10P 76/40* (2026.01)
*H10P 50/00* (2026.01)
*H10P 50/64* (2026.01)

(52) U.S. Cl.
CPC ........ *H10P 76/4088* (2026.01); *H10P 50/642* (2026.01); *H10P 50/692* (2026.01); *H10P 50/695* (2026.01); *H10P 50/71* (2026.01); *H10P 76/405* (2026.01); *H10P 76/4083* (2026.01); *H10P 76/4085* (2026.01)

(58) Field of Classification Search
None
See application file for complete search history.

(56) References Cited

U.S. PATENT DOCUMENTS 10,304,744 B1 * 5/2019 Joseph ................. H10D 84/016
2017/0154809 A1 * 6/2017 Kim .................. H01L 21/76885
2020/0111668 A1 * 4/2020 O'Toole .................. H10P 50/73

OTHER PUBLICATIONS

H. Xiao, Introduction to Semiconductor Manufacturing Technology, SPIE Press, pp. 573-575. (Year: 2012).*
G. Shinn et al., "Chemical-Mechanical Polishing", in Handbook of Semiconductor Manufacturing Technology 2nd Edition, CRC Press, p. 17-43) (Year: 2007).*

* cited by examiner

*Primary Examiner* — Jiong-Ping Lu
(74) *Attorney, Agent, or Firm* — Slater Matsil, LLP

(57) ABSTRACT

A method for processing a substrate includes forming a first hardmask layer over a target layer and a second hardmask layer over the first hardmask layer, and patterning the second hardmask layer. The method further includes forming a tone inversion mask between portions of the patterned second hardmask layer, removing the patterned second hardmask layer, patterning the first hardmask layer using the tone inversion mask as an etching mask, and etching the target layer using the patterned first hardmask layer as another etching mask.

20 Claims, 21 Drawing Sheets

METHOD FOR PROCESSING A SUBSTRATE

TECHNICAL FIELD

The present invention relates generally to semiconductor manufacturing, and, in particular embodiments, to a method for processing a substrate.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Process flows used to form the constituent structures of semiconductor devices often involve depositing and removing a variety of materials while a pattern of several materials may be exposed in a surface of the working substrate.

The minimum dimension of features in a patterned layer is shrunk periodically to roughly double the component density at each successive technology node, thereby reducing the cost per function. Innovations in patterning, such as immersion deep ultraviolet (i-DUV) lithography, multi patterning, and 13.5 nm wavelength extreme ultraviolet (EUV) optical systems have brought some critical dimensions down to near ten nanometers. This squeezes the margin for pattern misalignment (e.g., Total Edge Placement Error) and leads to, for example, stricter overlay requirements in multi patterning for advanced technology nodes (7 nm and below). As such, innovative process flows are useful for reducing pattern misalignment.

SUMMARY

In accordance with an embodiment, a method for processing a substrate includes: forming a first hardmask layer over a target layer and a second hardmask layer over the first hardmask layer; patterning the second hardmask layer; forming a tone inversion mask between portions of the patterned second hardmask layer; removing the patterned second hardmask layer; patterning the first hardmask layer using the tone inversion mask as an etching mask; and etching the target layer using the patterned first hardmask layer as another etching mask.

In accordance with another embodiment, a method for processing a substrate includes: forming a mandrel over a target layer; forming a first cut mandrel and a second cut mandrel from the mandrel with a mandrel cut process; forming a spacer layer over the first cut mandrel and the second cut mandrel, the spacer layer filling a cut between the first cut mandrel and the second cut mandrel; etching the spacer layer, where remaining portions of the spacer layer form spacers; exposing a first hardmask layer by removing the first cut mandrel and the second cut mandrel, the first hardmask layer being over the target layer; transferring a first pattern of the spacers to the first hardmask layer; forming a tone inversion mask between portions of the patterned first hardmask layer; and transferring a second pattern of the tone inversion mask to the target layer with a subtractive etching process, where a tone of the second pattern is the reverse of a tone of the first pattern.

In accordance with yet another embodiment, a method for processing a substrate includes: forming a first hardmask layer over a conductive layer and a second hardmask layer over the first hardmask layer; forming a first mandrel and a second mandrel over the second hardmask layer; forming a spacer layer over the first mandrel and the second mandrel; forming a non-mandrel block between the first mandrel and the second mandrel; performing an anisotropic etching technique on the spacer layer, where a first remaining portion of the spacer layer form spacers around sidewalls of the first mandrel and the second mandrel, and where a second remaining portion of the spacer layer under the non-mandrel block forms a bottom spacer; exposing the second hardmask layer by removing the first mandrel and the second mandrel; transferring a pattern of the spacers and the bottom spacer to the first hardmask layer; forming a tone inversion mask between portions of the patterned second hardmask layer; removing the patterned second hardmask layer; patterning the first hardmask layer using the tone inversion mask as an etching mask; and performing a subtractive etch on the conductive layer using the patterned first hardmask layer as another etching mask.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which:

FIG. 6A illustrates a plan view of a semiconductor device at an intermediate stage of fabrication, in accordance with some embodiments;

Figure 1A:
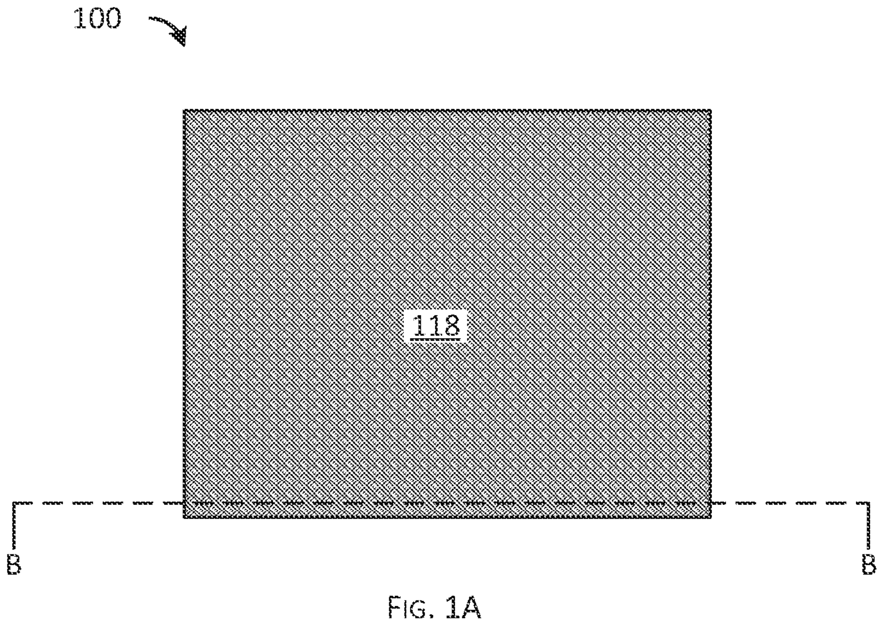
FIG. 1A illustrates a plan view of a semiconductor device at an intermediate stage of fabrication, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

According to one or more embodiments of the present disclosure, this application relates to methods for processing a substrate, including subtractive methods of metal interconnect formation. Available existing technology and disclosed intellectual property may not provide sufficient solutions for subtractive etch integration. In order to form interconnect structures by subtractive patterning or etching of metal layers, it is desirable to reverse tone of the interconnect pattern from a design for a process flow in which metal lines and vias are formed with an additive process (e.g., a damascene process flow).

Embodiments of the present disclosure include a process flow which enables subtractive metal formation of an interconnect metal grid design with tight pitches between metal lines of the grid. A tone inversion strategy for a subtractive etch is employed with self-aligned double patterning processes such as self-aligned blocks (SAB) or self-aligned litho-etch-litho-etch (SALELE). By using two hard mask layers and a tone inversion coat, the tone of a pattern formed in the top hard mask is reversed in the bottom hard mask, allowing for a subtractive etch of an underlying target error. Decoupling the patterning formation and tone inversion steps may reduce integration complexity, including reducing the number of colors needed for etching selectivity. For example, instead of having etch selectivity between three different materials in various layers, embodiments of the disclosure may include etch selectivity between two different materials in various layers. The above features may provide better control of the pattern transfer between layers, which can reduce edge placement error (EPE), improve line roughness performance, and increase process control of critical dimensions (CDs).

The present disclosure includes a process flow with a mandrel cut performed after a mandrel formation. A spacer layer formed over the cut mandrels may merge to form blocks with seams covering the cut mandrels. Bottom spacers are formed using non-mandrel blocks formed over the spacer layer prior to a spacer etch. Hard mask layers may include stop layers in order to stop, for example, chemical mechanical polish (CMP) processes.

Embodiments of the disclosure are described in the context of the accompanying drawings. Embodiments of a process flow for patterning a target layer over a substrate will be described using FIGS. 1A, 1B, 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, and 18B. Embodiments of methods for processing substrates will be described using FIGS. 19, 20, and 21.

Figure 1B:
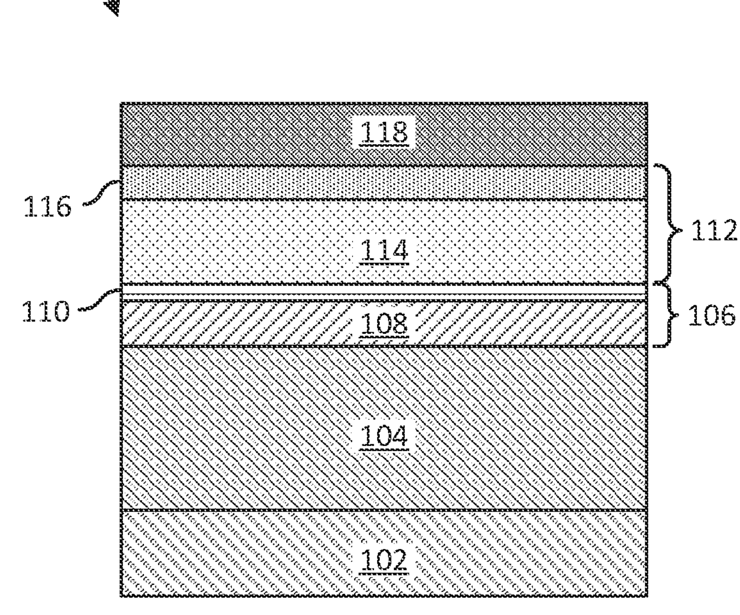
FIG. 1B illustrates a cross-sectional view of a semiconductor device at an intermediate stage of fabrication, in accordance with some embodiments.

FIGS. 1A and 1B illustrate a plan view and a cross-sectional view of a semiconductor structure 100, in accordance with some embodiments. FIG. 1B is illustrated in a cross-sectional view along line B-B in FIG. 1A. The semiconductor structure 100 comprises a substrate 102, a target layer 104 over the substrate 102, a first hardmask layer 106 over the target layer 104, a second hardmask layer 112 over the first hardmask layer 106, and a mandrel layer 118 over the second hardmask layer 112.

In some embodiments, the substrate 102 is a silicon wafer, or a silicon-on-insulator (SOI) wafer. In certain embodiments, the substrate 102 comprises a silicon germanium wafer, silicon carbide wafer, gallium arsenide wafer, gallium nitride wafer and other compound semiconductors. In other embodiments, the substrate 102 comprises heterogeneous layers such as silicon germanium on silicon, gallium nitride on silicon, silicon carbon on silicon, as well layers of silicon on a silicon or SOI substrate. In various embodiments, the substrate 102 is patterned or embedded in other components of the semiconductor device. In various embodiments, the substrate 102 may be a part of a semiconductor device, and may have undergone a number of steps of processing following, for example, a conventional process. The substrate 102 accordingly may comprise layers of semiconductors useful in various microelectronics. For example, the semiconductor structure 100 may comprise a substrate 102 in which various device regions are formed. The substrate 102 may further comprise one or more interconnect layers of an interconnect structure, over which another interconnect layer will be formed using the process flow illustrated by FIGS. 1A-18B. In some embodiments, a top layer of the substrate 102 is an etch stop layer (not separately illustrated) used to stop a subsequent etching process through the target layer 104.

The target layer 104 is formed over the substrate 102. In some embodiments, the target layer 104 comprises a conductive material such as a metal and may be referred to as a conductive layer. For example, the conductive material may be copper (Cu) formed using electroplating. However, any suitable conductive material (e.g., ruthenium (Ru), tin (Sn), tungsten (W), titanium (Ti), hafnium (Hf), silver (Ag), gold (Au), cobalt (Co), nickel (Ni), molybdenum (Mb), niobium (Nb), tantalum (Ta), rhodium (Rh), iridium (Ir), palladium (Pd), indium (In), zinc (Zn), antimony (Sb), the like, or a combination thereof) and deposition method (e.g., ALD, PVD, or the like) may be used. In other embodiments, the target layer 104 comprises a dielectric material such as a silicon-based dielectric material with a low dielectric constant (i.e., low-k value) (e.g., organosilicate glass (SiCOH), dense SiCOH, porous SiCOH, and other porous dielectric materials).

In various embodiments, a cover layer (not illustrated) is formed over the target layer 104 with a spin-on process and comprises spin-on glass (SOG). In other embodiments, the cover layer comprises materials formed using CVD such as silicon oxynitride ($SiO_xN_y$), silicon dioxide, silicon nitride, silicon carbide, metal oxide, the like, or a combination thereof. The cover layer may reduce or prevent gouging of the underlying target layer 104 during a subsequent patterning of overlying layers.

The first hardmask layer 106 is formed over the target layer 104. In some embodiments, the first hardmask layer 106 comprises a first mask layer 108 and a first stop layer 110 over the first mask layer 108. The first stop layer 110 is used to stop a removal process (e.g., a chemical mechanical polish (CMP), etch back, or the like) of an overlying layer. In various embodiments, the first mask layer 108 comprises titanium nitride, titanium, titanium oxide, tantalum, other tungsten based compounds, ruthenium based compounds, aluminum based compounds, amorphous silicon, the like, or a combination thereof, and the first stop layer 110 comprises silicon nitride, silicon carbide, silicon oxynitride, silicon oxycarbide, silicon carbonitride, silicon oxycarbonitride, tungsten carbide, the like, or a combination thereof. The first hardmask layer 106 may be formed with a spin-on process, CVD, ALD, the like, or a combination thereof. However, any suitable materials and methods may be used to form the first hardmask layer 106.

The second hardmask layer 112 (also referred to as a tone inversion layer) is formed over the first hardmask layer 106. The second hardmask layer 112 is used to invert the tone of a patterning process transferring a pattern to the target layer 104. This may provide better control of the pattern transfer between layers, which can reduce edge placement error (EPE), improve line roughness performance, and increase process control of critical dimensions (CDs). In some embodiments, the second hardmask layer 112 comprises a second mask layer 114 over the first mask layer 108 and a second stop layer 116 over the second hardmask layer 112. The second hardmask layer 112 may be formed using similar materials and methods as described above with respect to the first hardmask layer 106, and the details are not repeated herein. However, any suitable materials and methods may be used to form the second hardmask layer 112.

The mandrel layer 118 is formed over the second hardmask layer 112 with a suitable deposition process, such as spin-on, CVD, ALD, the like, or a combination thereof. The mandrel layer 118 will be subsequently patterned to form mandrels 218 (see below, FIGS. 3A-3B) for self-aligned processes such as self-aligned litho-etch-litho-etch (SALELE) or self-aligned block (SAB) processes. In some embodiments, the mandrel layer 118 comprises amorphous silicon, amorphous carbon, metal oxide, metal nitride, metal, or any other type of sacrificial material known within the art. The mandrel layer 118 may also compromise a plasma polymerized organic film, spin on film, or dielectric film.

Figure 2A:
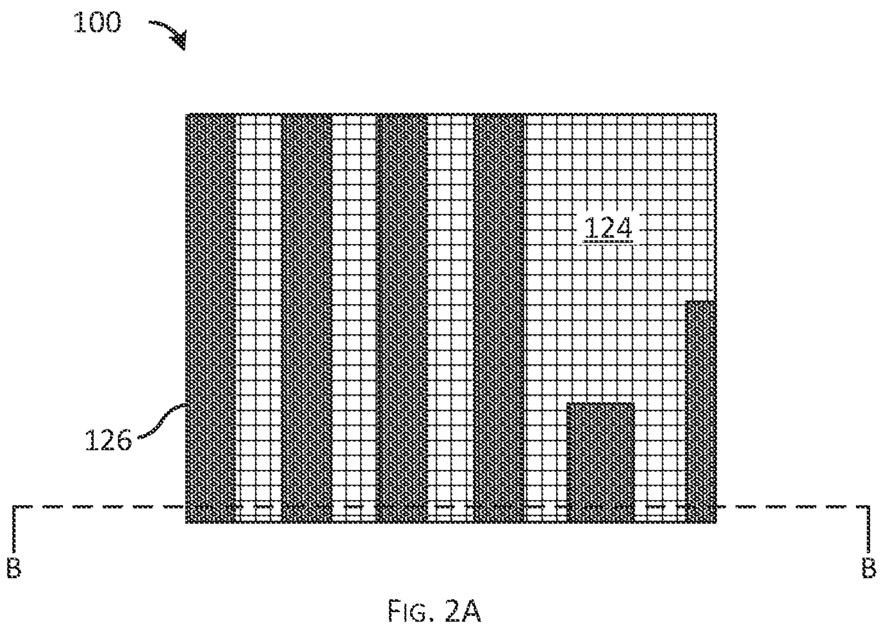
FIG. 2A illustrates a plan view of a semiconductor device at an intermediate stage of fabrication, in accordance with some embodiments.
Figure 2B:
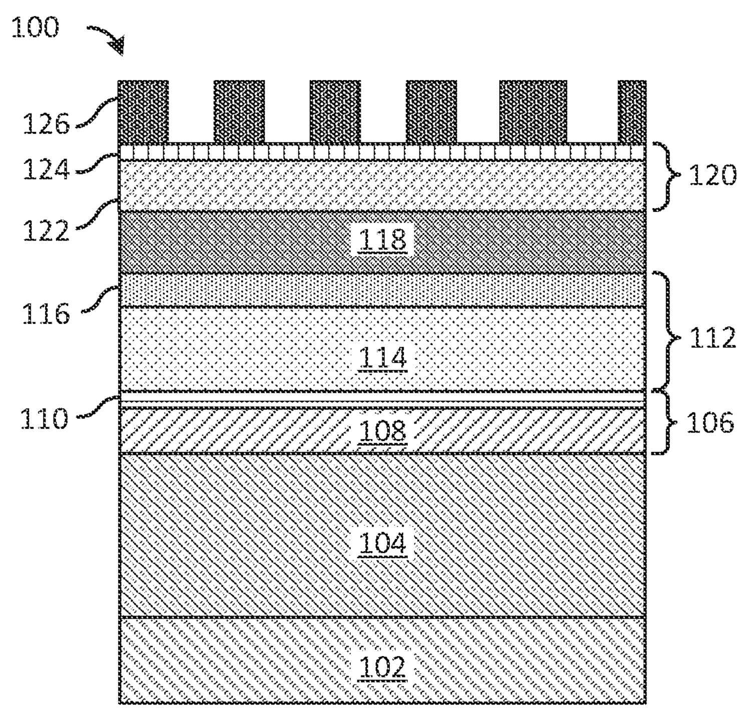
FIG. 2B illustrates a cross-sectional view of a semiconductor device at an intermediate stage of fabrication, in accordance with some embodiments.

Next, in FIGS. 2A and 2B, a first lithography stack 120 is formed over the mandrel layer 118, in accordance with some embodiments. As illustrated in FIGS. 2A-2B, the first lithography stack 120 comprises a planarizing layer 122 over the mandrel layer 118 and an antireflective coating 124 over the planarizing layer 122. In some embodiments, the planarizing layer 122 comprises spin-on carbon (SOC), an organic planarizing layer (OPL), amorphous carbon, or the like. In some embodiments, the antireflective coating 124 comprises a bottom antireflective coating (BARC) such as a silicon antireflective coating (SiARC), an organic BARC, SiC, spin-on glass (SOG), silicon, silicon oxide, silicon nitride, or the like. However, any suitable materials may be used for the first lithography stack 120, including the planarizing layer 122 and the antireflective coating 124.

A patterned resist 126 is formed over the first lithography stack 120. The patterned resist 126 is used for the subsequent patterning of the mandrel layer 118 (see below, FIGS. 3A-3B). In some embodiments, the patterned resist 126 is a metal oxide resist that is exposed with extreme ultraviolet (EUV) radiation and developed with a wet etch selective to either exposed or unexposed regions of the metal oxide resist. In various embodiments, the patterned resist 126 comprises tin (Sn), antimony (Sb), hafnium (Hf), zirconium (Zr), zinc (Zn), the like, or a combination thereof. In certain embodiments, the patterned resist 126 comprises a metal oxide, a metal alkoxide, or a methacrylate (MAA) of Sn, Sb, Hf, Zr, Zn, or the like. In other embodiments, the patterned resist 126 is a photoresist that does not include metal oxide, e.g., a photopolymeric photoresist. However, any suitable photoresist, exposure method, and development method may be used to form the patterned resist 126.

Figure 3A:
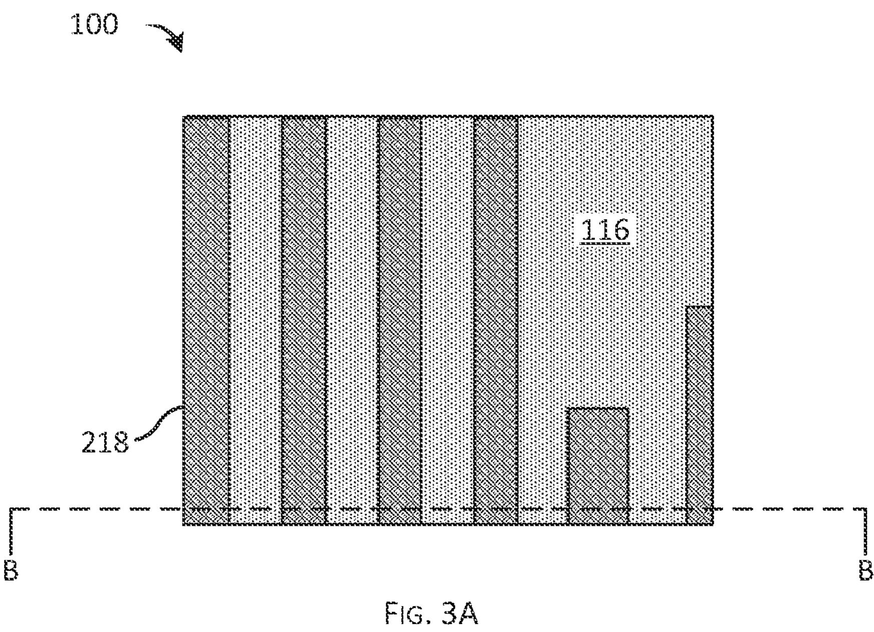
FIG. 3A illustrates a plan view of a semiconductor device at an intermediate stage of fabrication, in accordance with some embodiments.
Figure 3B:
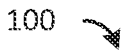
FIG. 3B illustrates a cross-sectional view of a semiconductor device at an intermediate stage of fabrication, in accordance with some embodiments.
Figure 3B:
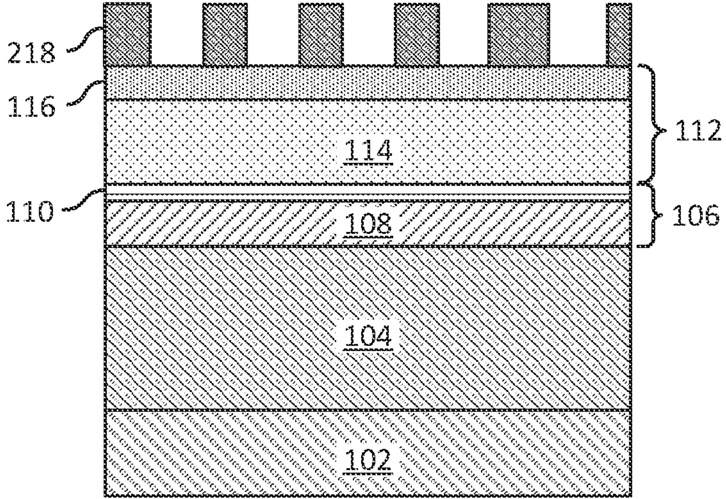

In FIGS. 3A and 3B, the mandrel layer 118 (see above, FIGS. 2A-2B) is patterned to form mandrels 218, in accordance with some embodiments. Although six mandrels 218 are illustrated in FIG. 3A-3B with four full-length mandrels crossing the top view of FIG. 3A and two shortened mandrels on a right side of the four full-length mandrels, any suitable number of mandrels 218 with any suitable lengths and arrangements may be formed. For example, additional mandrels (not illustrated) with any suitable lengths may be present on the right and left sides of FIG. 3A. In some embodiments, the mandrels 218 are formed with a multi-step etching process. For example, the patterned resist 126 may be used as an etch mask to pattern a portion of the first lithography stack 120 with a suitable wet or dry etching process (e.g., an RIE process or the like using anisotropic plasma etching). The patterned portion of the first lithography stack 120 is then used as an etch mask to etch the remaining portion of the first lithography stack 120. Next, the remaining portion of the first lithography stack 120 is used as an etch mask to form the mandrels 218. After patterning the mandrels 218, any remaining portions of the first lithography stack 120 and the patterned resist 126 are removed with a suitable process, such as a CMP, an etch back, or the like.

Figure 4A:
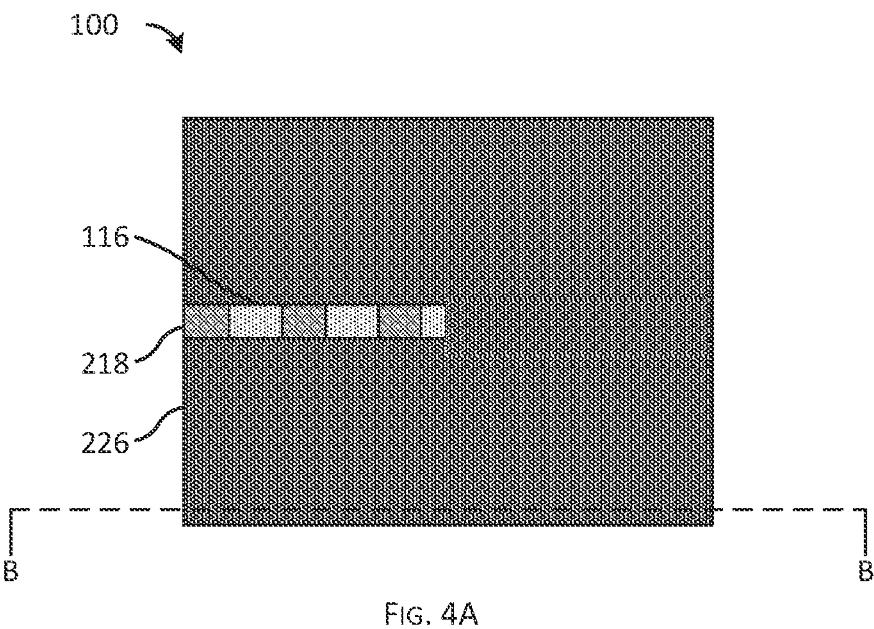
FIG. 4A illustrates a plan view of a semiconductor device at an intermediate stage of fabrication, in accordance with some embodiments.
Figure 4B:
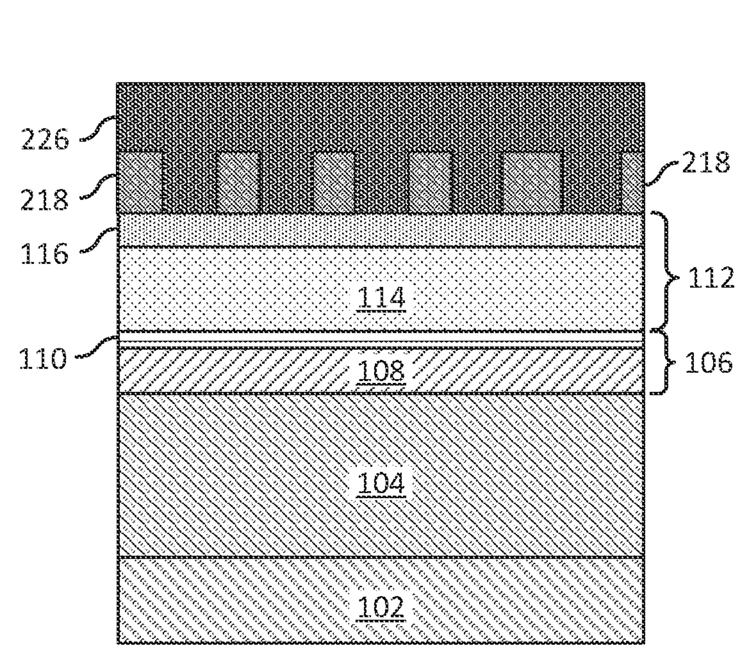
FIG. 4B illustrates a cross-sectional view of a semiconductor device at an intermediate stage of fabrication, in accordance with some embodiments.

Next, in FIGS. 4A and 4B, a patterned resist 226 is formed over the mandrels 218 and exposed portions of the second hardmask layer 112, in accordance with some embodiments. The patterned resist 226 comprises one or more trenches or holes that expose portions of the mandrels 218 that will be subsequently cut with a mandrel cut process (see below, FIGS. 5A-5B). As illustrated by FIGS. 4A-4B, the patterned resist 226 exposes a rectangular region (also referred to as a trench) across three mandrels 218. However, the patterned resist 226 may expose any suitable numbers and portions of the mandrels 218 in order to form any desired cuts through the mandrels 218.

The patterned resist 226 may be formed using similar methods and materials as the patterned resist 126 as described above with respect to FIGS. 2A-2B, and the details are not repeated herein. In some embodiments, additional layers of a lithography stack may be formed over the mandrels 218 and exposed portions of the second hardmask layer 112 prior to forming the patterned resist 226. However, any suitable methods and materials may be used to form the patterned resist 226.

Figure 5A:
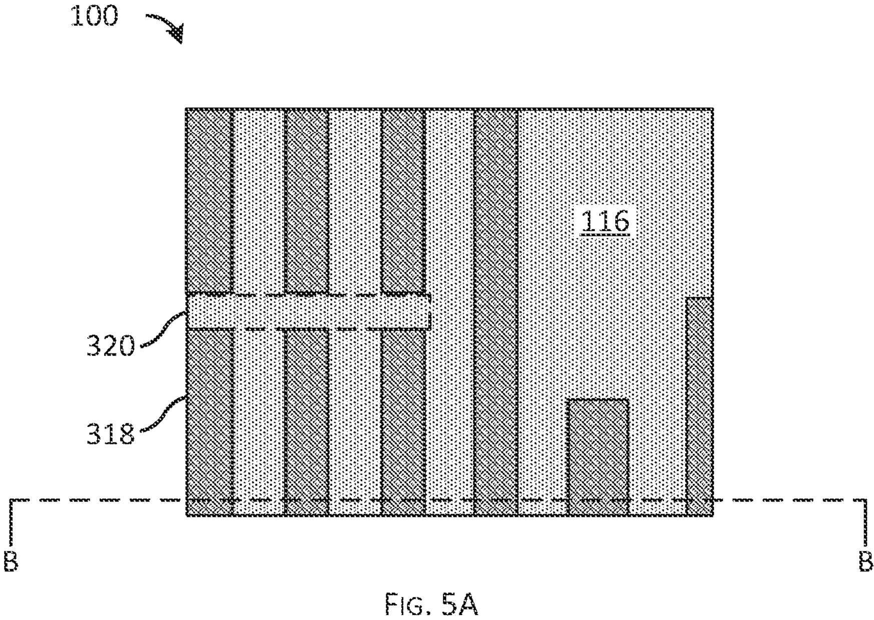
FIG. 5A illustrates a plan view of a semiconductor device at an intermediate stage of fabrication, in accordance with some embodiments.
Figure 5A:
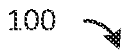
Figure 5B:
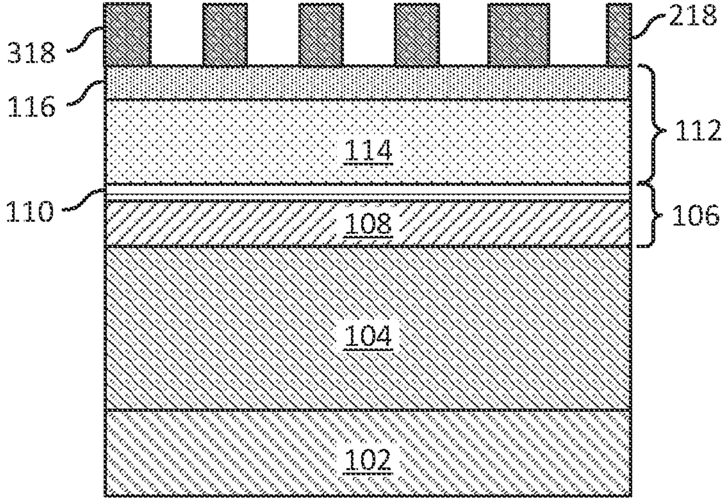
FIG. 5B illustrates a cross-sectional view of a semiconductor device at an intermediate stage of fabrication, in accordance with some embodiments.

Subsequently, in FIGS. 5A and 5B, a mandrel cut process is performed to form a cut 320 through one or more of the mandrels 218 to form cut mandrels 318, in accordance with some embodiments. In some embodiments, the patterned resist 226 (and any underlying layers of a lithography stack, if present) is used as an etch mask to form the cut 320 with a suitable wet or dry etching process (e.g., an RIE process or the like using anisotropic plasma etching). After forming the cut 320 through the cut mandrels 318, any remaining portions of the patterned resist 226 (and any underlying layers of a lithography stack, if present) are removed with a suitable process, such as a CMP, an etch back, or the like. As illustrated by FIG. 5A, the cut 320 bisects three cut mandrels 318. However, any suitable numbers of cuts 320 may be formed in any suitable positions in order to form any desired cuts through the cut mandrels 318.

Figure 6B:
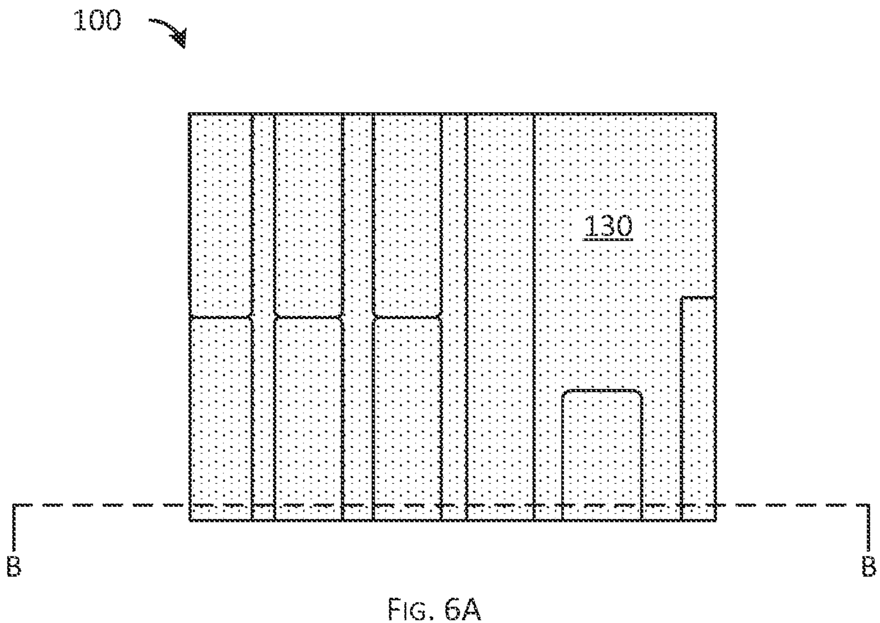
FIG. 6B illustrates a cross-sectional view of a semiconductor device at an intermediate stage of fabrication, in accordance with some embodiments.
Figure 6B:
Figure 6B:
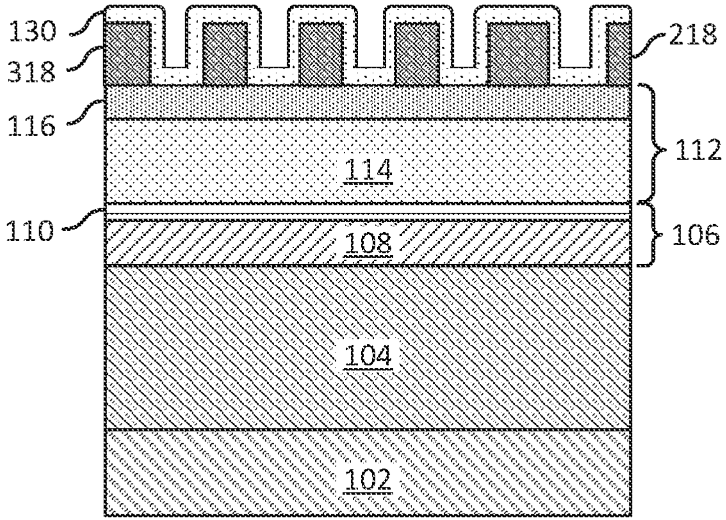

In FIGS. 6A and 6B, a spacer layer 130 is formed over the mandrels 218, cut mandrels 318, and exposed portions of the second hardmask layer 112, in accordance with some embodiments. The spacer layer 130 may be formed by depositing spacer material roughly conformally over the over the mandrels 218, cut mandrels 318, and exposed portions of the second hardmask layer 112 with a suitable process such as ALD or the like. In some embodiments, the spacer material is an oxide or nitride such as titanium oxide, titanium nitride, silicon oxide, silicon nitride, zirconium oxide, the like, or a combination thereof. The spacer material is different from the material of the mandrels 218 and cut mandrels 318 so that subsequent etches may be selective to the mandrels 218 and cut mandrels 318 over spacers subsequently formed from the spacer layer 130 (see below, FIGS. 11A-11B). In some embodiments, the spacer layer 130 fills the cut 320 between respective portions of cut mandrels 318 so that portions of the spacer layer 130 over the cut mandrels 318 meet and merge at seams between the respective portions of the cut mandrels 318. As such, the spacer layer 130 may form merged blocks that cover cut mandrels 318 across the cuts 320 between the cut mandrels 318.

Figure 7A:
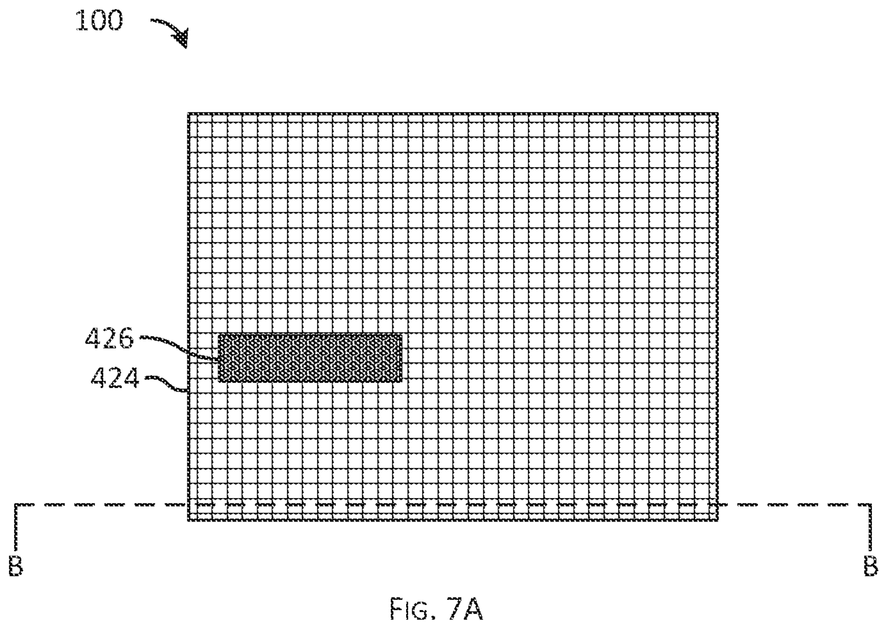
FIG. 7A illustrates a plan view of a semiconductor device at an intermediate stage of fabrication, in accordance with some embodiments.
Figure 7B:
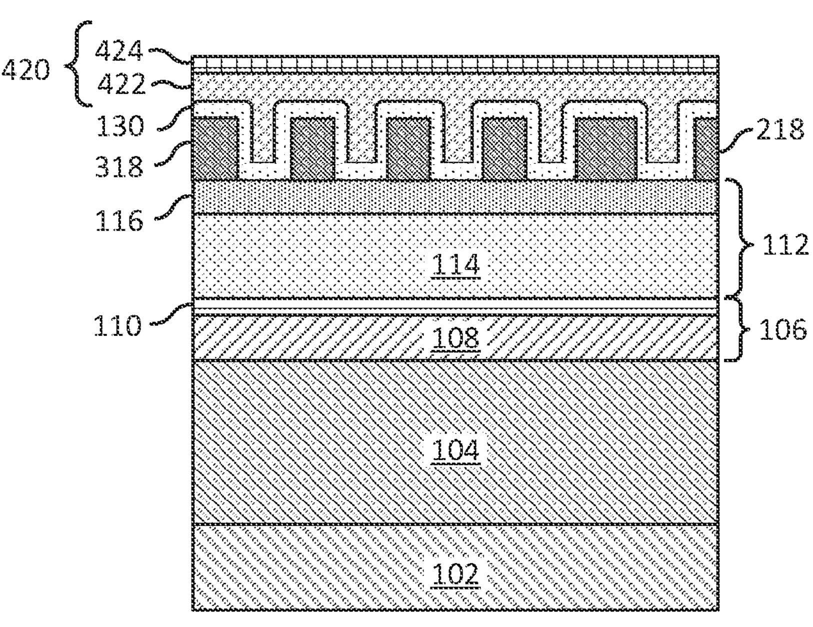
FIG. 7B illustrates a cross-sectional view of a semiconductor device at an intermediate stage of fabrication, in accordance with some embodiments.

Next, in FIGS. 7A and 7B, a second lithography stack 420 is formed over the spacer layer 130 and a patterned resist 426 is formed over the second lithography stack 420, in accordance with some embodiments. As illustrated in FIGS. 7A-7B, the second lithography stack 420 comprises a planarizing layer 422 over the spacer layer 130 and an antireflective coating 424 over the planarizing layer 422. The second lithography stack 420 and the patterned resist 426 may be formed with similar methods and materials as the first lithography stack 120 and the patterned resist 126 as described above with respect to FIGS. 2A-2B, and the details are not repeated herein.

In some embodiments, the patterned resist 426 is formed as one or more horizontal bars in a plan view with longitudinal directions being perpendicular to longitudinal directions of the cut mandrels 318 and mandrels 218. The patterned resist 426 may be used to protect portions of the planarizing layer 422 in order to form blocks (see below, FIGS. 8A-8B) between cut mandrels 318. Although the patterned resist 426 is illustrated as extending over three cut mandrels 318, the patterned resist 426 may be formed in any suitable numbers and positions, and all such configurations are within the scope of the disclosed embodiments.

Figure 8A:
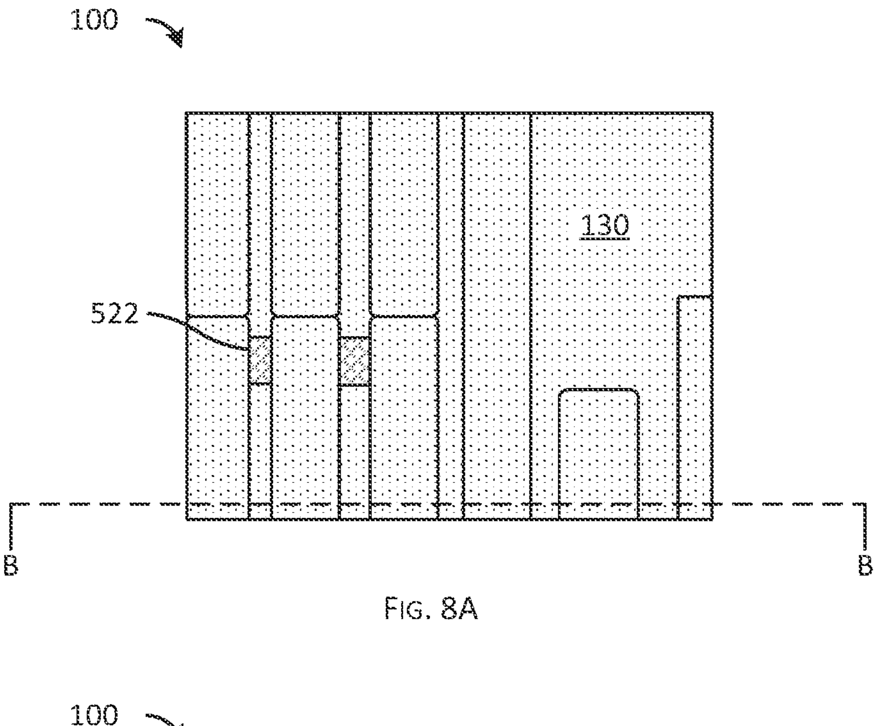
FIG. 8A illustrates a plan view of a semiconductor device at an intermediate stage of fabrication, in accordance with some embodiments.
Figure 8B:
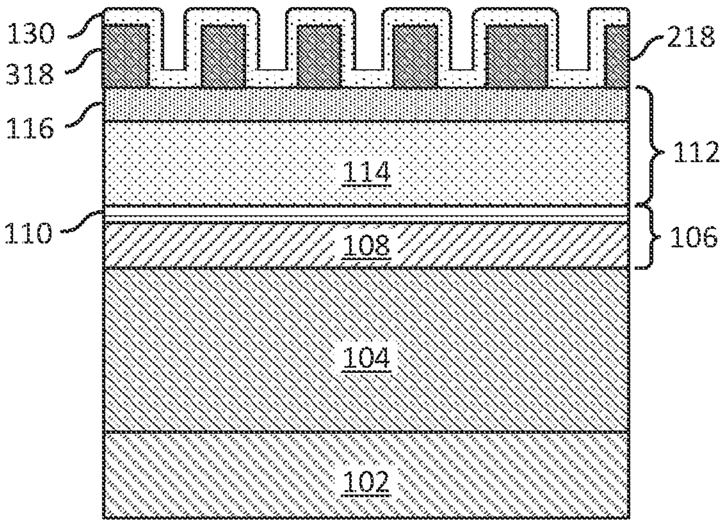
FIG. 8B illustrates a cross-sectional view of a semiconductor device at an intermediate stage of fabrication, in accordance with some embodiments.

Subsequently, in FIGS. 8A and 8B, the patterned resist 426, the antireflective coating 424, and portions of the planarizing layer 422 are removed with a suitable process, such as a wet or dry etching process (e.g., an RIE process or the like using anisotropic plasma etching), in accordance with some embodiments. Remaining portions of the planarizing layer 422 under the patterned resist 426 are protected by the patterned resist 426 and form blocks 522 (also referred to as non-mandrel blocks). The blocks 522 are between sidewalls of the spacer layer 130 and over cut mandrels 318 or mandrels 218. The blocks 522 may be used to form bottom spacers used in subsequent patterning processes.

In other embodiments, the blocks 522 are formed by forming a mask (e.g., a patterned photoresist) over the semiconductor structure 100 as illustrated above in FIGS. 6A-6B with trenches that expose one or more regions of the spacer layer 130 over cut mandrels 318. The trenches are subsequently filled with a material (e.g., spin-on carbon). The mask and a top portion of the material over top surfaces of the spacer layer 130 are then removed with a suitable process (e.g., an etch back or CMP) to form the blocks 522. However, any suitable process or materials may be used to form the blocks 522.

Figure 9A:
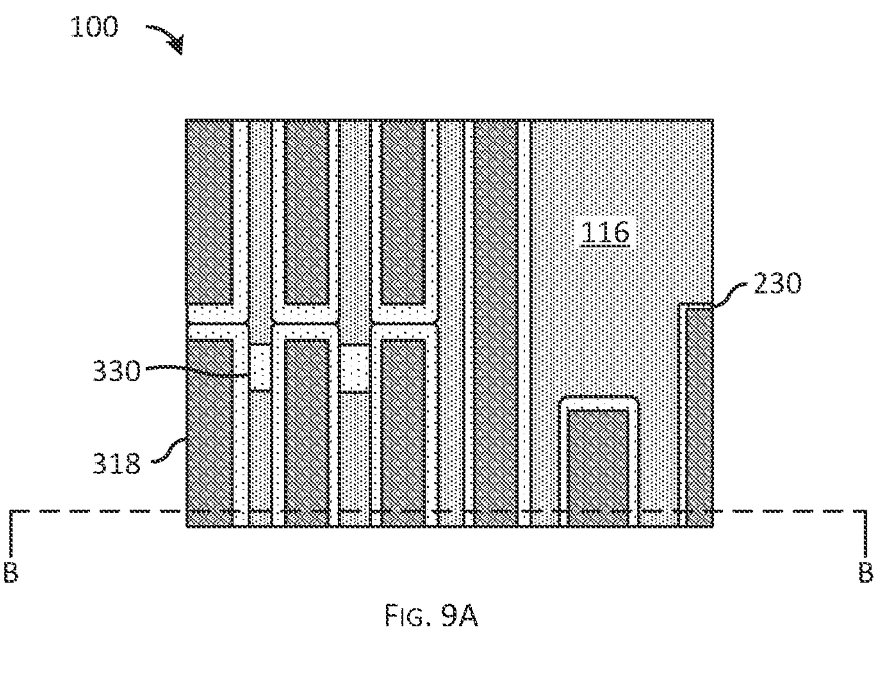
FIG. 9A illustrates a plan view of a semiconductor device at an intermediate stage of fabrication, in accordance with some embodiments.
Figure 9B:
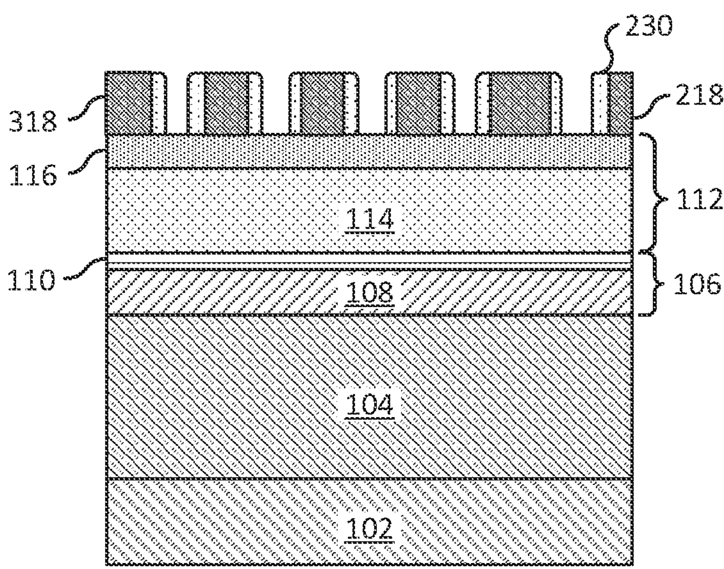
FIG. 9B illustrates a cross-sectional view of a semiconductor device at an intermediate stage of fabrication, in accordance with some embodiments.

In FIGS. 9A and 9B, the spacer layer 130 is etched to form spacers 230 and bottom spacers 330, in accordance with some embodiments. The material of the spacer layer 130 is selectively etched using an anisotropic etching technique (e.g., a reactive ion etch (RIE)) that clears the tops of the mandrels 218 and cut mandrels 318 and removes spacer material from over the first stop layer 116 between the mandrels 218 and cut mandrels 318 to form the spacers 230 around sidewalls of the mandrels 218 and cut mandrels 318.

Spacer material under the blocks 522 is protected from the anisotropic etching technique by the blocks 522 and forms bottom spacers 330, which extend between adjacent spacers 230 and cover portions of the first stop layer 116. The blocks 522 may be removed by the anisotropic etching technique or by a subsequent suitable removal process such as an ashing. The bottom spacers 330 may have a smaller vertical thickness than the vertical thickness of the spacers 230, so that a top surface of the bottom spacers 300 is below a top surface of the spacers 230.

Figure 10A:
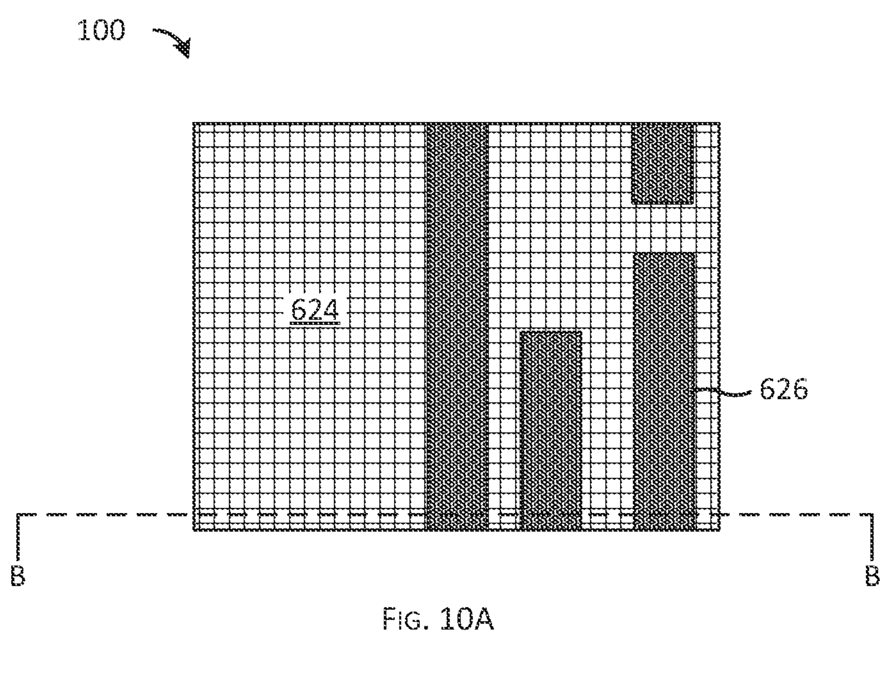
FIG. 10A illustrates a plan view of a semiconductor device at an intermediate stage of fabrication, in accordance with some embodiments.
Figure 10B:
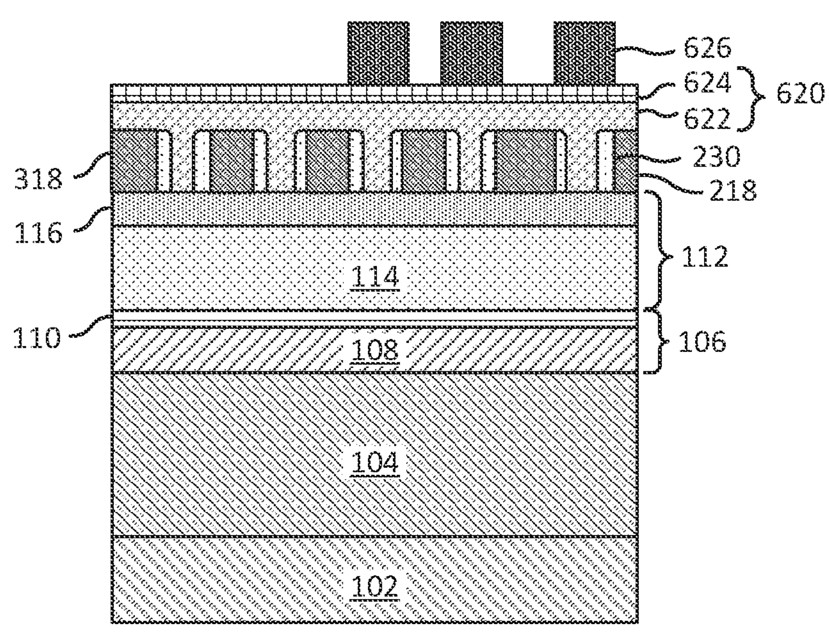
FIG. 10B illustrates a cross-sectional view of a semiconductor device at an intermediate stage of fabrication, in accordance with some embodiments.

Subsequently, in FIGS. 10A and 10B, a third lithography stack 620 is formed over the spacers 230, bottom spacers 330, mandrels 218, cut mandrels 318, and first stop layer 116, and a patterned resist 626 is formed over the third lithography stack 620, in accordance with some embodiments. As illustrated in FIGS. 10A-10B, the third lithography stack 620 comprises: a planarizing layer 622 over the spacers 230, bottom spacers 330, mandrels 218, cut mandrels 318, and first stop layer 116; and an antireflective coating 624 over the planarizing layer 622. The third lithography stack 620 and the patterned resist 626 may be formed with similar methods and materials as the first lithography stack 120 and the patterned resist 126 as described above with respect to FIGS. 2A-2B, and the details are not repeated herein.

In some embodiments, the patterned resist 626 is formed as one or more bars with longitudinal directions being parallel to longitudinal directions of the cut mandrels 318 and mandrels 218. The bars of the patterned resist 626 may be formed over spacers 230 on sidewalls of adjacent mandrels 218 or cut mandrels 318. The bars of the patterned resist 626 may have staggered lengths or be separated by vertical gaps in a plan view. The patterned resist 426 may be used to protect portions of the third lithography stack 620 in order to form blocks (see below, FIGS. 11A-11B) between cut mandrels 318. Although the patterned resist 426 is illustrated as extending over three cut mandrels 318, the patterned resist 426 may be formed in any suitable numbers and positions, and all such configurations are within the scope of the disclosed embodiments.

Figure 11A:
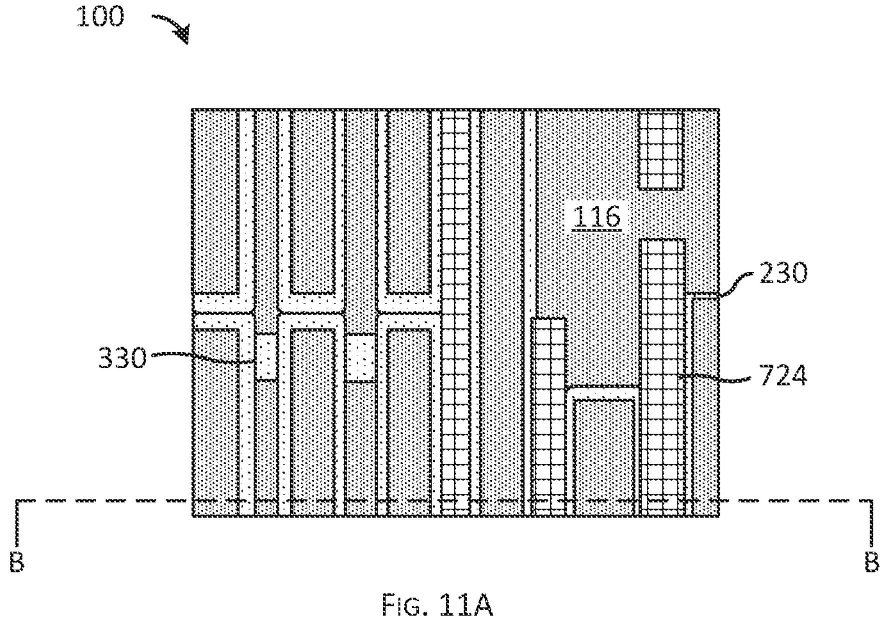
FIG. 11A illustrates a plan view of a semiconductor device at an intermediate stage of fabrication, in accordance with some embodiments.
Figure 11B:
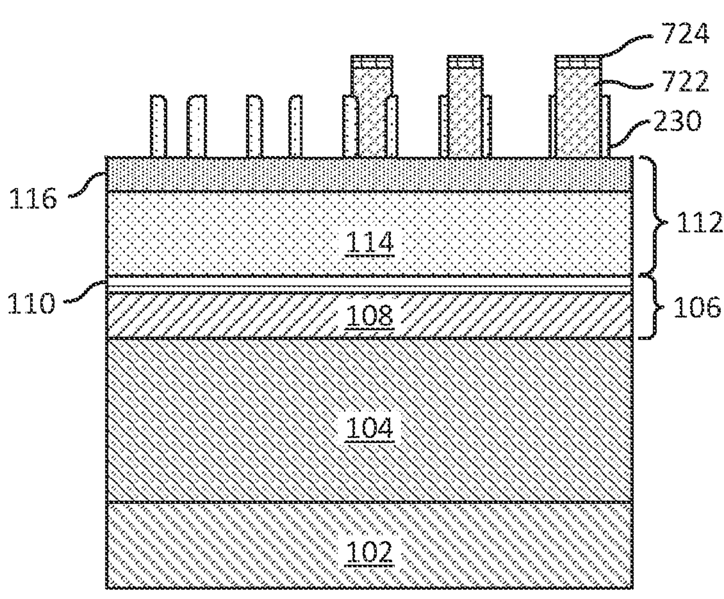
FIG. 11B illustrates a cross-sectional view of a semiconductor device at an intermediate stage of fabrication, in accordance with some embodiments.

Next, in FIGS. 11A and 11B, an etching process is performed to remove portions of the third lithography stack 620, the mandrels 218, and the cut mandrels 318, in accordance with some embodiments. The patterned resist 626 protects underlying portions of the planarizing layer 622 during the etching process so that the underlying portions form blocks 722. In some embodiments, patterned portions 724 of the antireflective coating 624 remain over the blocks 722 after the etching process. Any remaining portions of the patterned resist 626 are removed with a suitable process, such as a CMP, an etch back, or the like.

The mandrels 218 and the cut mandrels 318 may be removed with a suitable dry or wet etching process (e.g., an RIE or the like using anisotropic plasma etching) that is selective to the material of the mandrels 218 and the cut mandrels 318 over the materials of the spacers 230, the bottom spacers 330, and the first stop layer 116. In some embodiments, the mandrels 218 and cut mandrels 318 are removed with a same etching process as the portions of the third lithography stack 620. In other embodiments, the portions of the third lithography stack 620 are removed with a different etching process than the etching process subsequently used to remove the mandrels 218 and the cut mandrels 318. After removing the mandrels 218 and the cut mandrels 318, the spacers 230, the bottom spacers 330, and the blocks 722 form a pattern that is subsequently transferred to underlying layers (see below, FIGS. 12A-17B).

Figure 12A:
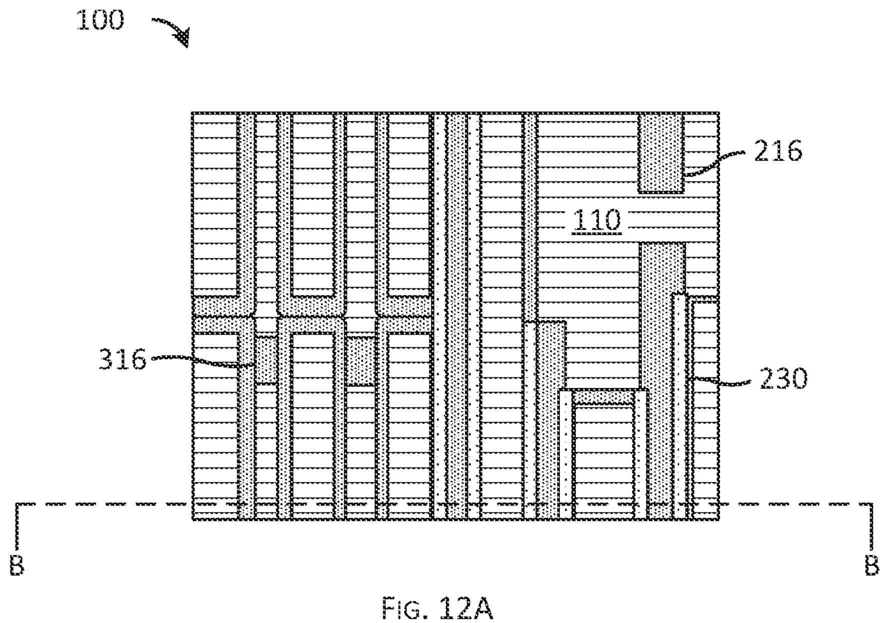
FIG. 12A illustrates a plan view of a semiconductor device at an intermediate stage of fabrication, in accordance with some embodiments.
Figure 12B:
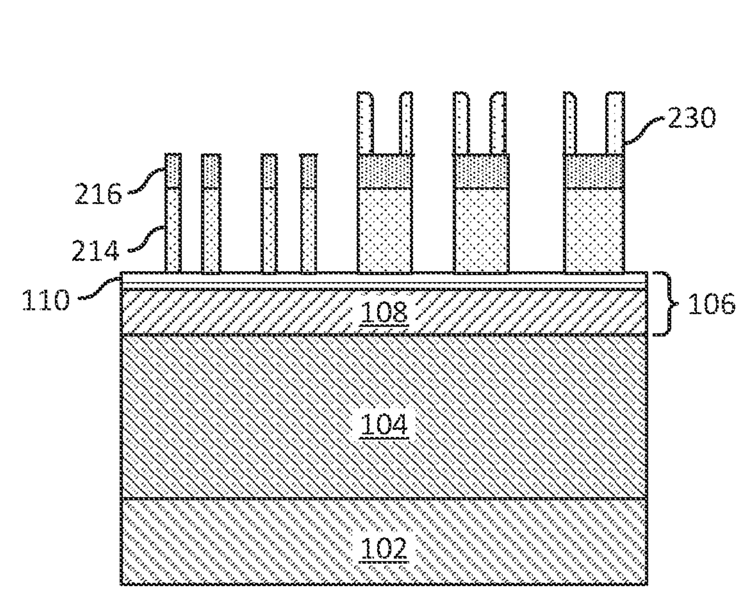
FIG. 12B illustrates a cross-sectional view of a semiconductor device at an intermediate stage of fabrication, in accordance with some embodiments.

In FIGS. 12A and 12B, the pattern of the spacers 230, the bottom spacers 330, and the blocks 722 is transferred to the second hardmask layer 112, in accordance with some embodiments. The spacers 230, the bottom spacers 330, and the blocks 722 are used as an etching mask in an etching process (e.g., a suitable wet or dry process) to extend the pattern of the spacers 230, the bottom spacers 330, and the blocks 722 through the second hardmask layer 112. This etching process patterns the second stop layer 116 and the second mask layer 114 to form a patterned stop layer 216 over a patterned mask 214. Portions of a top surface of the first hardmask layer 106 may be exposed by the patterned mask 214. The spacers 230, the bottom spacers 330, the patterned portions 724 (if present), and the blocks 722 are removed by the etching process. In some embodiments, portions of the spacers 230 remain over the patterned stop layer 216.

Figure 13A:
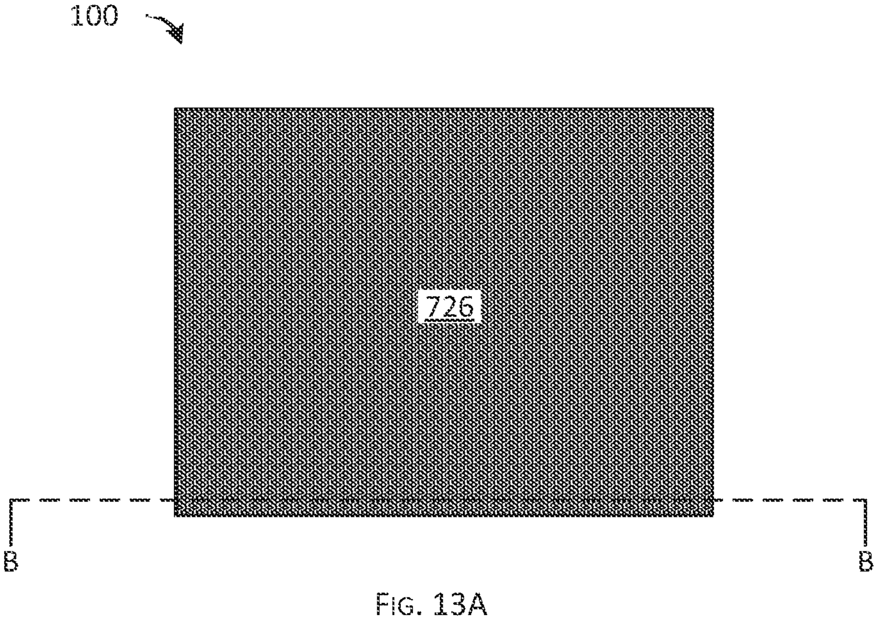
FIG. 13A illustrates a plan view of a semiconductor device at an intermediate stage of fabrication, in accordance with some embodiments.
Figure 13B:
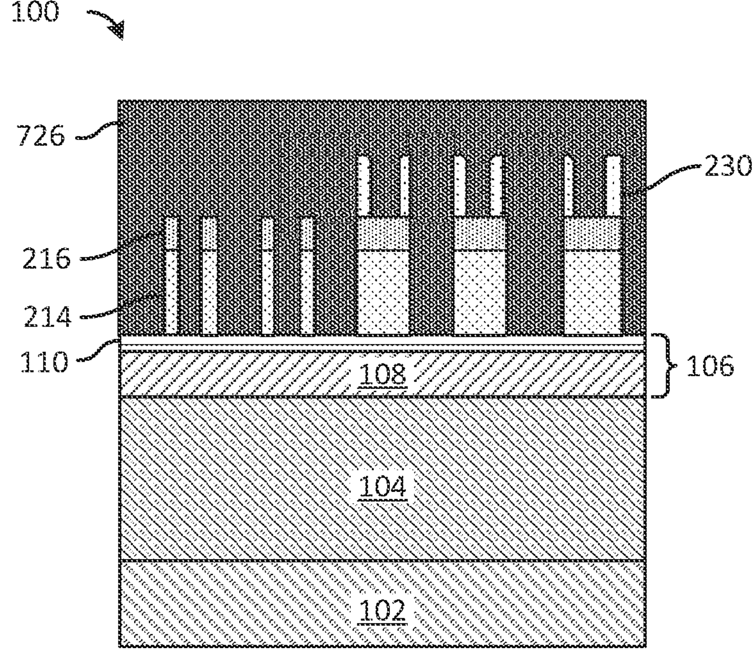
FIG. 13B illustrates a cross-sectional view of a semiconductor device at an intermediate stage of fabrication, in accordance with some embodiments.

Next, in FIGS. 13A and 13B, a tone inversion coat 726 is formed over remaining portions of the spacers 230 (if present), the patterned stop layer 216, the patterned mask 214, and exposed portions of the top surface of the first hardmask layer 106, in accordance with some embodiments. The tone inversion coat 726 fills spaces (e.g., trenches or holes) between portions of the patterned mask 214 and the patterned stop layer 216. The tone inversion coat 726 is used to invert the tone of the patterning process, so that portions of the target layer 104 under the patterned mask 214 may be etched through in a subsequent subtractive process while remaining portions of the target layer 104 are protected by another patterned mask with an opposite tone from the patterned mask 214 (see below, FIGS. 14A-17B). This may provide better control of the pattern transfer by enabling a subtractive etch of the target layer 104, which can reduce edge placement error (EPE), improve line roughness performance, and increase process control of critical dimensions (CDs).

The tone inversion coat 726 comprises an oxide such as titanium oxide, silicon oxide, aluminum oxide, another material such as, amorphous silicon, amorphous carbon, spin-on carbon, the like, or a combination thereof. The tone inversion coat 726 may be formed with a spin-on process, CVD, ALD, the like, or a combination thereof. However, any suitable materials and methods may be used to form the tone inversion coat 726.

Figure 14A:
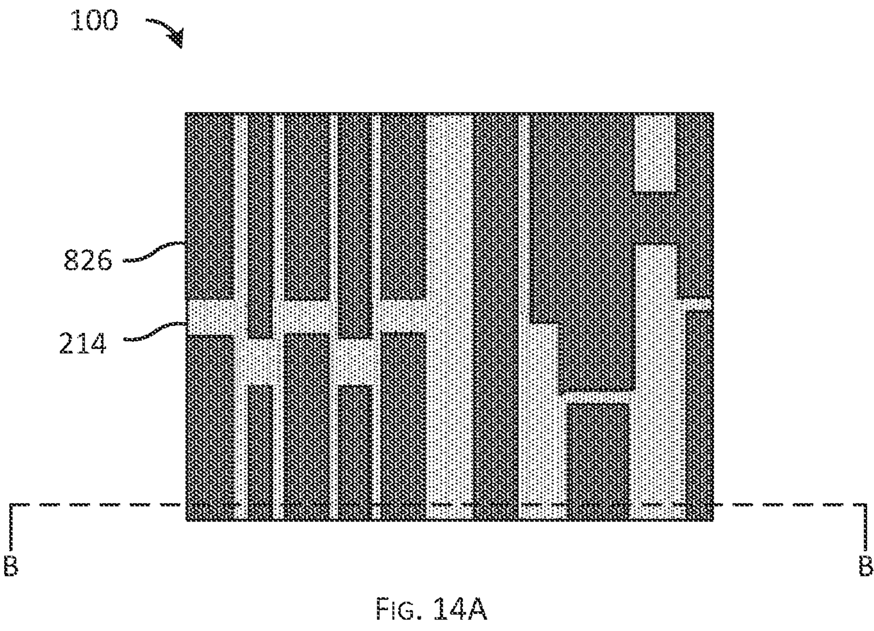
FIG. 14A illustrates a plan view of a semiconductor device at an intermediate stage of fabrication, in accordance with some embodiments.
Figure 14B:
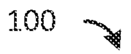
FIG. 14B illustrates a cross-sectional view of a semiconductor device at an intermediate stage of fabrication, in accordance with some embodiments.
Figure 14B:
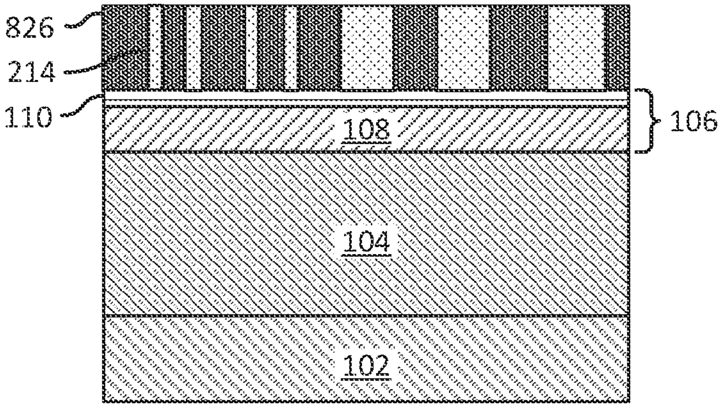

Subsequently, in FIGS. 14A and 14B, a top portion of the tone inversion coat 726 is removed to expose a top surface of the patterned mask 214, in accordance with some embodiments. The top portion of the tone inversion coat 726 may be removed with a suitable process such as a planarization (e.g., a CMP), an etch back, the like, or a combination thereof, with the remaining portion of the tone inversion coat 726 forming a tone inversion mask 826. In some embodiments where the removal process comprises a CMP, the patterned stop layer 216 is used to stop the removal process at a suitable height. The removal process may remove the remaining portions of the spacers 230 (if present) and the patterned stop layer 216. In some embodiments, portions of the patterned stop layer 216 remain over the patterned mask 214 after the removal process.

Figure 15A:
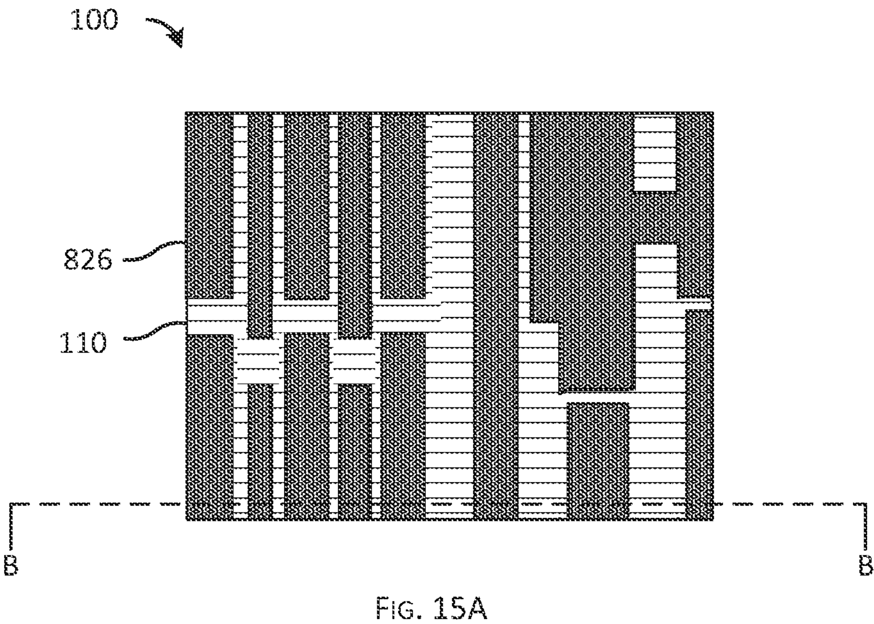
FIG. 15A illustrates a plan view of a semiconductor device at an intermediate stage of fabrication, in accordance with some embodiments.
Figure 15A:
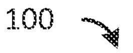
Figure 15B:
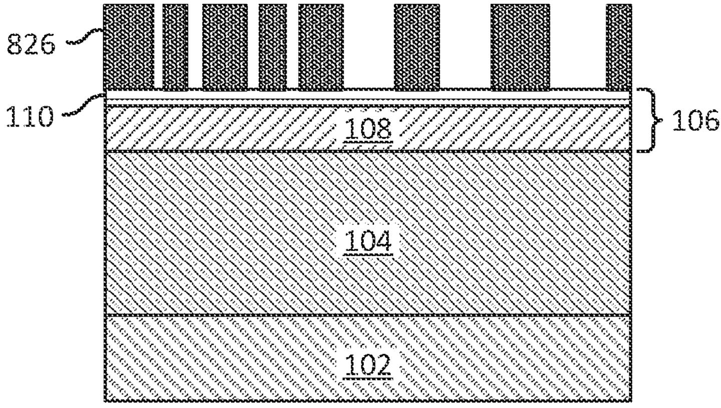
FIG. 15B illustrates a cross-sectional view of a semiconductor device at an intermediate stage of fabrication, in accordance with some embodiments.

In FIGS. 15A and 15B, the patterned mask 214 is removed to expose portions of the top surface of the first hardmask layer 106, in accordance with some embodiments. The patterned mask 214 may be removed with a suitable wet or dry etching process (e.g., a wet etch using ammonium hydroxide, hydrogen peroxide, or the like, or an RIE or the like using anisotropic plasma etching) that is selective to the material of the patterned mask 214 (and remaining portions of the patterned stop layer 216, if present) over the materials of the tone inversion mask 826. The tone of the tone inversion mask 826 is the reverse of the tone of the patterned mask 214 and is used to transfer the reversed pattern to underlying layers (see below, FIGS. 16A-17B).

Figure 16A:
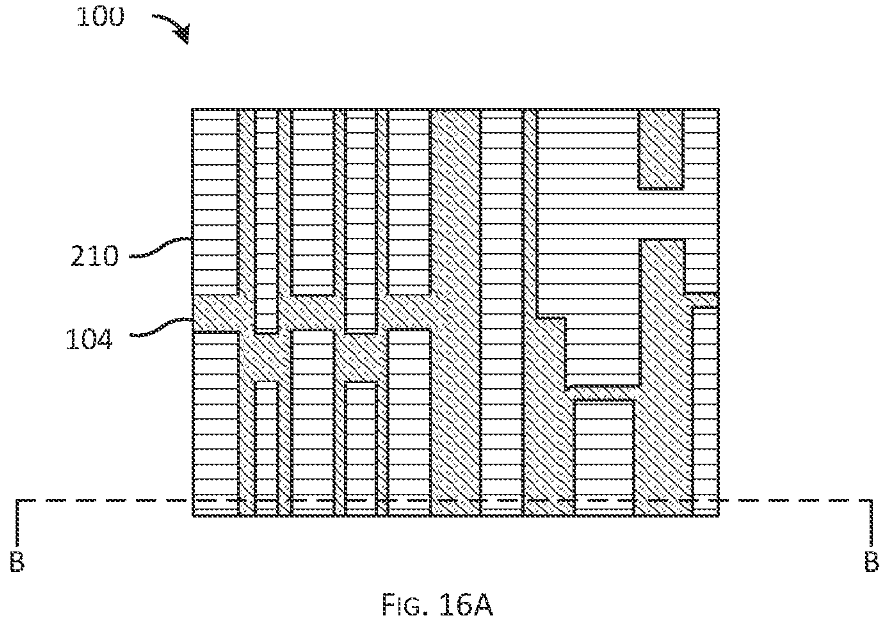
FIG. 16A illustrates a plan view of a semiconductor device at an intermediate stage of fabrication, in accordance with some embodiments.
Figure 16B:
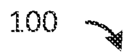
FIG. 16B illustrates a cross-sectional view of a semiconductor device at an intermediate stage of fabrication, in accordance with some embodiments.
Figure 16B:
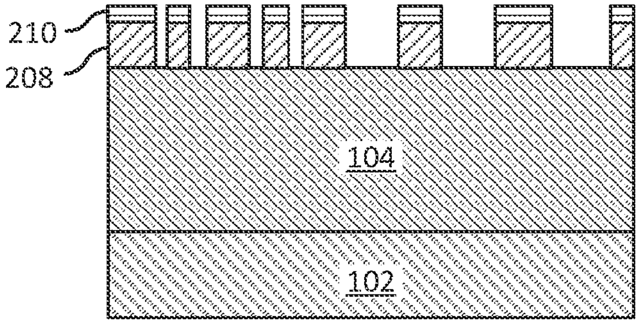

Next, in FIGS. 16A and 16B, the pattern of the tone inversion mask 826 is transferred to the first hardmask layer 106, in accordance with some embodiments. The tone inversion mask 826 is used as an etching mask in an etching process (e.g., a suitable wet or dry process) to extend the pattern of the tone inversion mask 826 through the first hardmask layer 106. This etching process patterns the first stop layer 110 and the first mask layer 108 to form a patterned stop layer 210 over a patterned mask 208. Portions of a top surface of the target layer 104 may be exposed by the patterned mask 208. In some embodiments, the tone inversion mask 826 is removed by the etching process. In other embodiments, the tone inversion mask 826 is removed by another process such as a planarization (e.g., a CMP) in which the patterned stop layer 210 is used to stop the planarization at a desired height. The planarization may also remove the patterned stop layer 210. In still other embodiments, portions of the tone inversion mask 826 remain over the patterned stop layer 210 after the etching process.

Figure 17A:
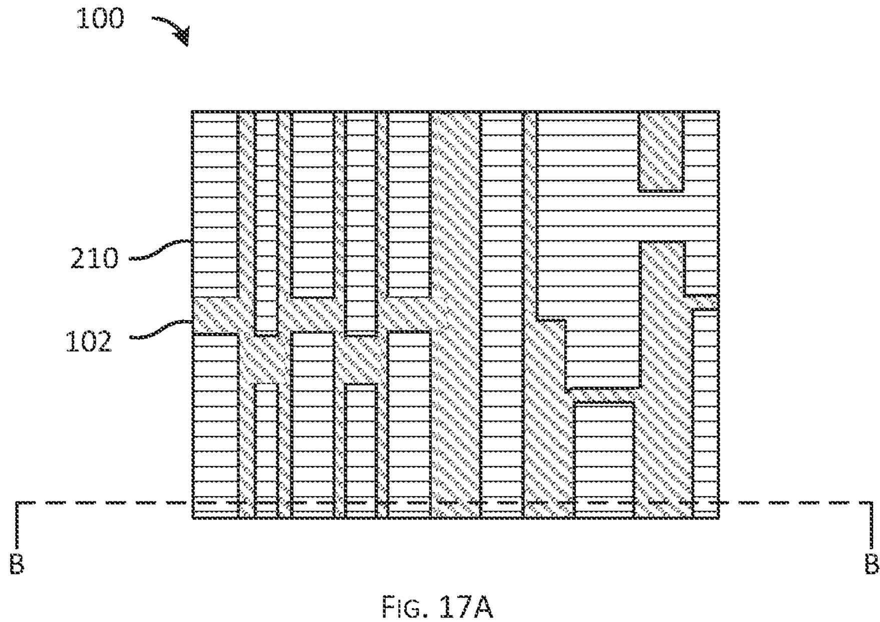
FIG. 17A illustrates a plan view of a semiconductor device at an intermediate stage of fabrication, in accordance with some embodiments.
Figure 17A:
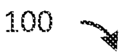
Figure 17B:
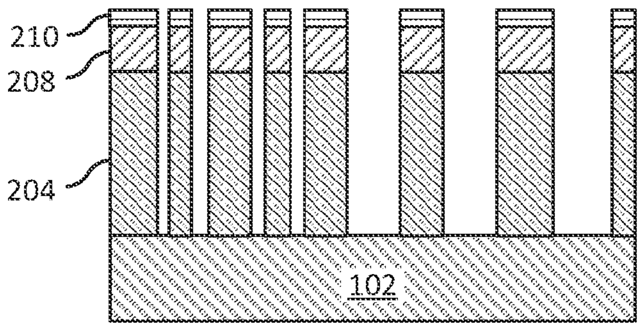
FIG. 17B illustrates a cross-sectional view of a semiconductor device at an intermediate stage of fabrication, in accordance with some embodiments.

Subsequently, in FIGS. 17A and 17B, the pattern of the patterned mask 208 is transferred to the target layer 104, in accordance with some embodiments. The patterned mask 208 is used as an etching mask in an etching process (e.g., a suitable wet or dry process) to extend the pattern of the patterned mask 208 through the target layer 104. This etching process patterns the target layer 104 to form a pattern 204 over the substrate 102. In various embodiments, a top layer of the substrate 102 is an etch stop layer (not separately illustrated) that is used to stop the etching process.

In some embodiments, the target layer 104 comprises a conductive material such as a metal as described above with respect to FIGS. 1A-1B, and the pattern 204 is a metallization pattern formed from the target layer 104 with a subtractive metal etch. In other embodiments, the target layer 104 comprises a dielectric material and the pattern 204 is a dielectric pattern between which a metallization pattern is subsequently formed (see below, FIGS. 18A-18B).

Figure 18A:
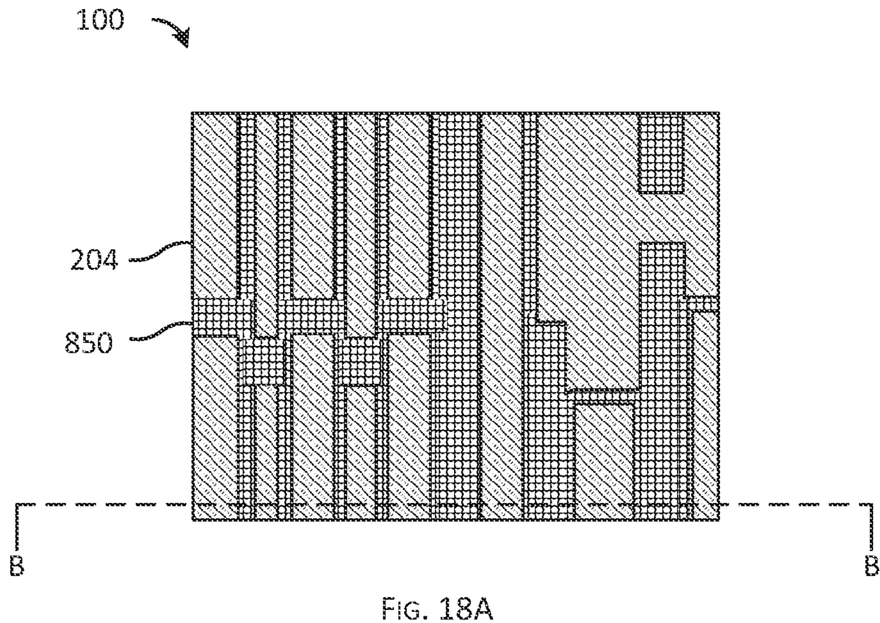
FIG. 18A illustrates a plan view of a semiconductor device at an intermediate stage of fabrication, in accordance with some embodiments.
Figure 18B:
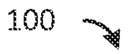
FIG. 18B illustrates a cross-sectional view of a semiconductor device at an intermediate stage of fabrication, in accordance with some embodiments.
Figure 18B:
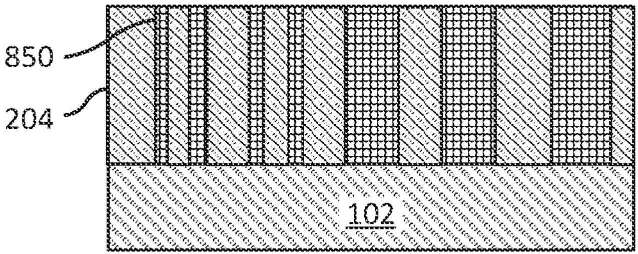

In FIGS. 18A and 18B, the gaps between the pattern 204 are filled with a filling layer 850, in accordance with some embodiments. As an example, when the pattern 204 is a metallization pattern, the gaps or trenches between the lines of the metallization pattern are filled with a dielectric material such as silicon oxide, silicon dioxide, silicon nitride, silicon carbide, a silicon-based dielectric material with a low dielectric constant (i.e., low-k value) (e.g., organosilicate glass (SiCOH), dense SiCOH, porous SiCOH, and other porous dielectric materials), silicon oxynitride ($SiO_xN_y$), the like, or a combination thereof. The dielectric material may be formed with a suitable process such as CVD, PECVD, ALD, spin-on, the like, or a combination thereof. However, any suitable process may be used to form the dielectric material for the filling layer 850. Excess dielectric material formed over a top surface of the pattern 204 may be removed with a suitable process, e.g. a CMP. Remaining portions of the patterned stop layer 210 and the patterned mask 208, if present, may be removed with the same process.

As another example, when the pattern 204 is a dielectric pattern, the gaps or trenches between the portions of the dielectric pattern are filled with a conductive material such as a metal. For example, the conductive material may be copper formed using electroplating. However, any suitable conductive material (e.g., as described above for the target layer 104 with respect to FIGS. 1A-1B) may be used. Excess conductive material formed over a top surface of the pattern 204 may be removed with a suitable process, e.g. a CMP. Remaining portions of the patterned stop layer 210 and the patterned mask 208, if present, may be removed with the same process.

Figure 19:
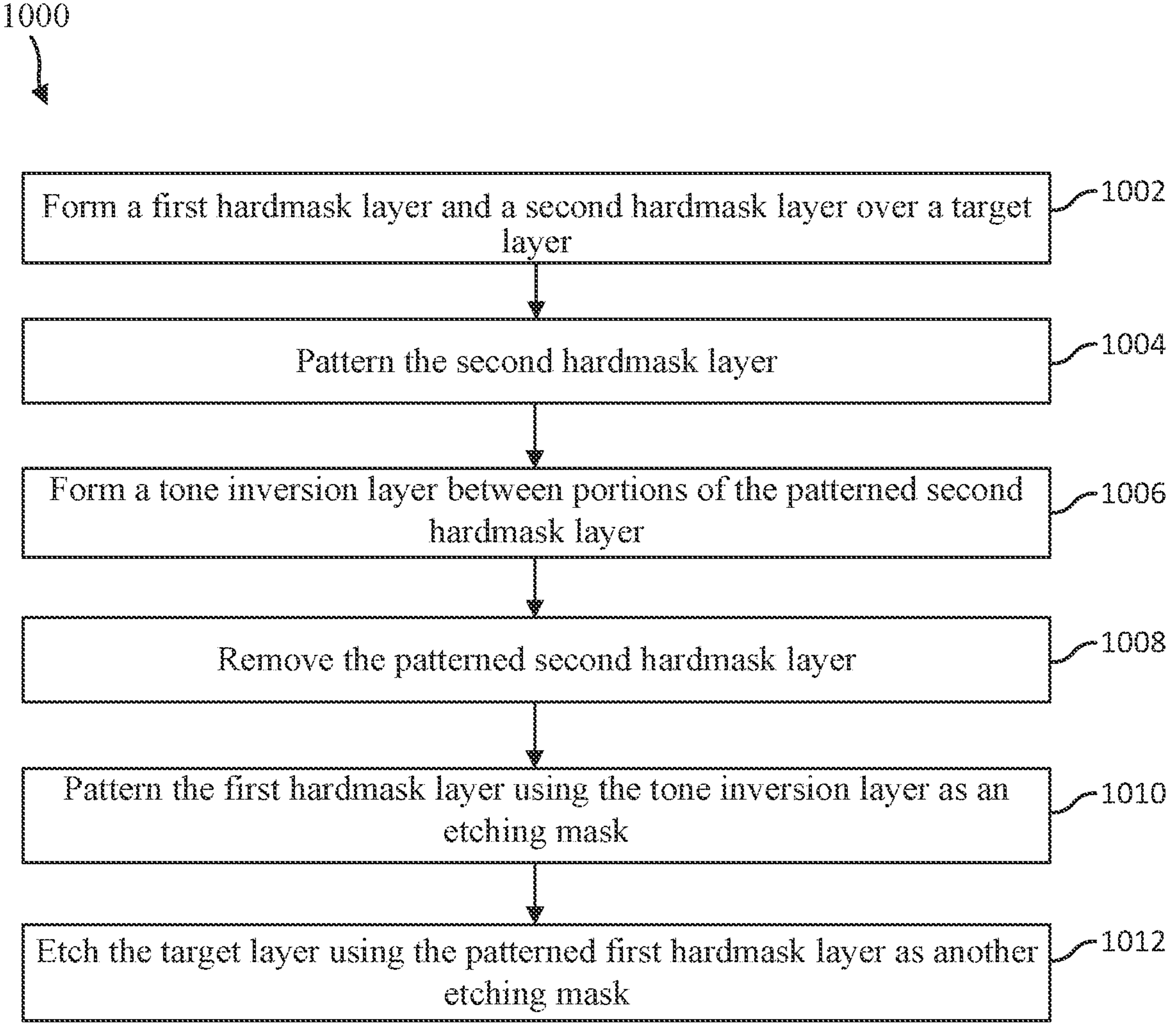
FIG. 19 illustrates a flow chart diagram for a method for processing a substrate, in accordance with some embodiments.

FIG. 19 illustrates a flow chart diagram of a method 1000 for processing a substrate, in accordance with some embodiments. In step 1002, a first hardmask layer is formed over a target layer and a second hardmask layer is formed over the first hardmask layer, as described above with respect to FIG. 1. In step 1004, the second hardmask layer is patterned, as described above with respect to FIGS. 2A-12B.

In step 1006, a tone inversion mask is formed between portions of the patterned second hardmask layer, as described above with respect to FIGS. 13A-14B. In step 1008, the patterned second hardmask layer is removed, as described above with respect to FIGS. 15A-15B.

In step 1010, the first hardmask layer is patterned using the tone inversion mask as an etching mask, as described above with respect to FIGS. 16A-16B. In step 1012, the target layer is etched using the patterned first hardmask layer as another etching mask, as described above with respect to FIGS. 17A-17B.

Figure 20:
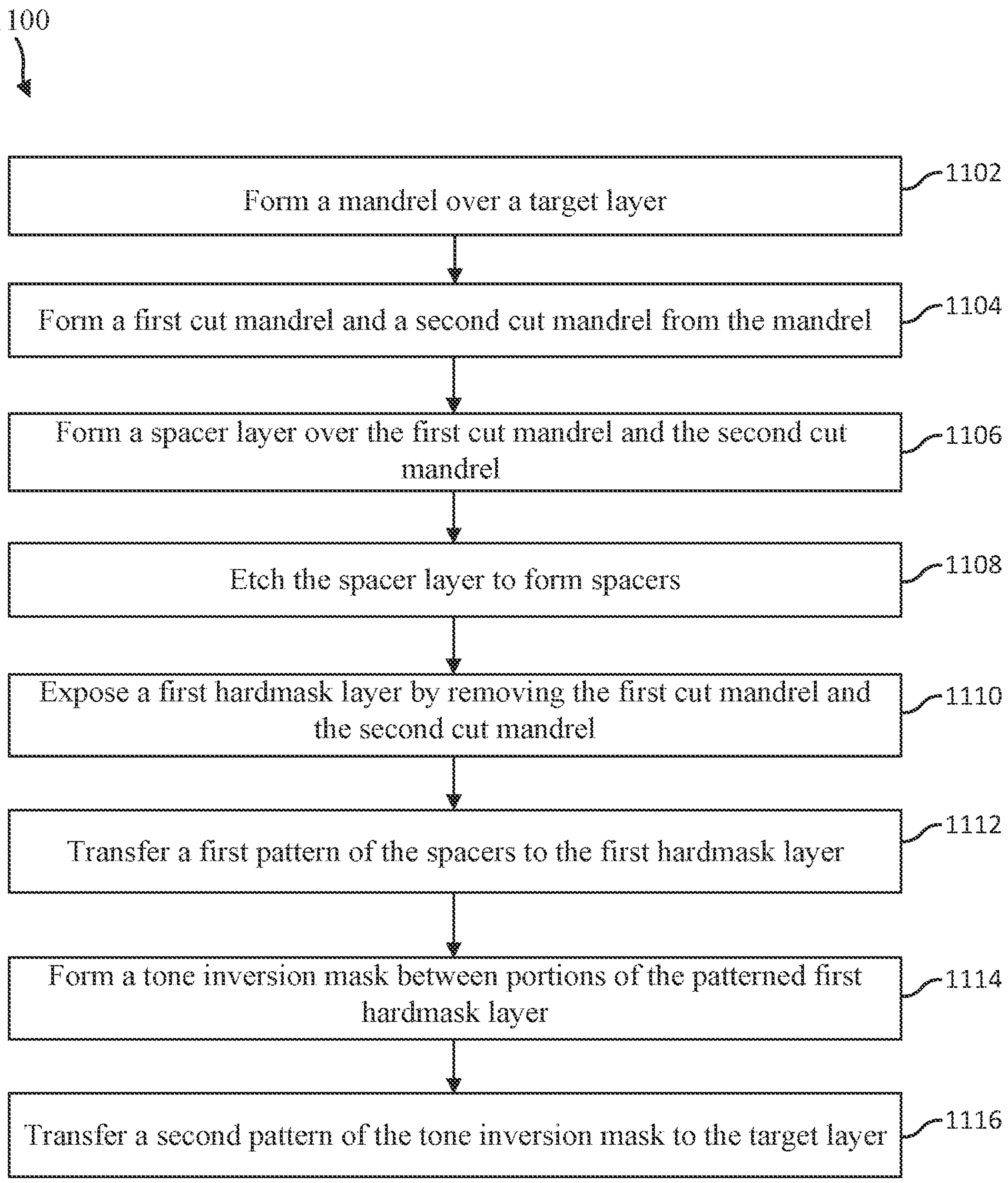
FIG. 20 illustrates a flow chart diagram for another method for processing a substrate, in accordance with some embodiments.

FIG. 20 illustrates a flow chart diagram of another method 1100 for processing a substrate, in accordance with some embodiments. In step 1102, a mandrel is formed over a target layer, as described above with respect to FIGS. 2A-3B. In step 1104, a first cut mandrel and a second cut mandrel are formed from the mandrel with a mandrel cut process, as described above with respect to FIGS. 4A-5B.

In step 1106, a spacer layer is formed over the first cut mandrel and the second cut mandrel, as described above with respect to FIGS. 6A-6B. The spacer layer fills a cut between the first cut mandrel and the second cut mandrel. In step 1108, the spacer layer is etched, as described above with respect to FIGS. 9A-9B. Remaining portions of the spacer layer form spacers.

In step 1110, a first hardmask layer over the target layer is exposed by removing the first cut mandrel and the second cut mandrel, as described above with respect to FIGS. 11A-11B. In step 1112, a first pattern of the spacers to the first hardmask layer, as described above with respect to FIGS. 12A-12B.

In step 1114, a tone inversion mask is formed between portions of the patterned first hardmask layer, as described above with respect to FIGS. 13A-14B. In step 1116, a second pattern of the tone inversion mask is transferred to the target layer with a subtractive etching process, as described above with respect to FIGS. 15A-17B. A tone of the second pattern is the reverse of a tone of the first pattern.

Figure 21:
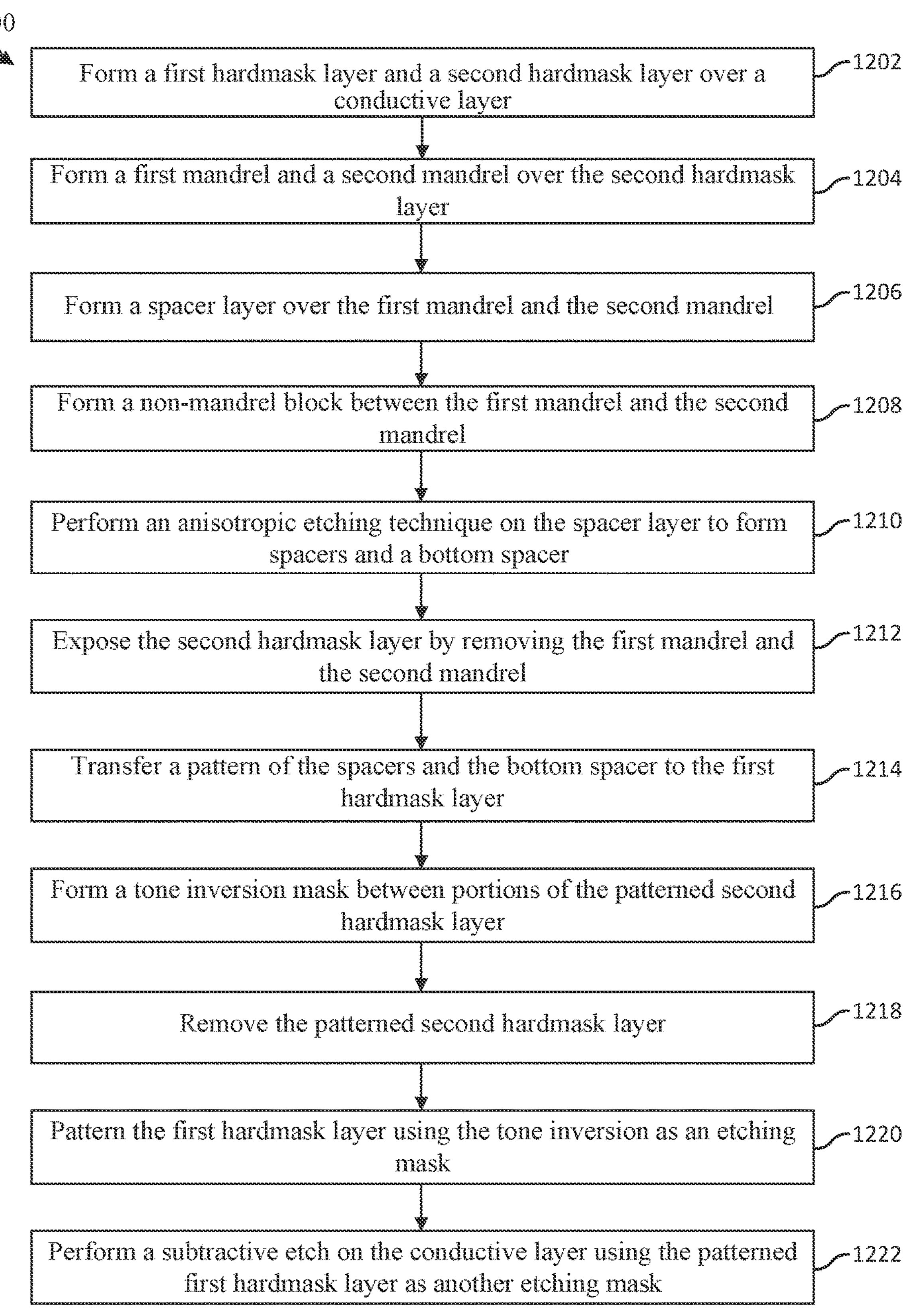
FIG. 21 illustrates a flow chart diagram for yet another method for processing a substrate, in accordance with some embodiments.

FIG. 21 illustrates a flow chart diagram of yet another method 1200 for processing a substrate, in accordance with some embodiments. In step 1202, a first hardmask layer is formed over a conductive layer and a second hardmask layer is formed over the first hardmask layer, as described above with respect to FIG. 1. In step 1204, a first mandrel and a second mandrel are formed over the second hardmask layer, as described above with respect to FIGS. 2A-3B.

In step 1206, a spacer layer is formed over the first mandrel and the second mandrel, as described above with respect to FIGS. 6A-6B. In step 1208, a non-mandrel block is formed between the first mandrel and the second mandrel, as described above with respect to FIGS. 7A-8B.

In step 1210, an anisotropic etching technique is performed on the spacer layer, as described above with respect to FIGS. 9A-9B. A first remaining portion of the spacer layer forms spacers around sidewalls of the first mandrel and the second mandrel. A second remaining portion of the spacer layer under the non-mandrel block forms a bottom spacer.

In step 1212, the second hardmask layer is exposed by removing the first mandrel and the second mandrel, as described above with respect to FIGS. 11A-11B. In step 1214, a pattern of the spacers and the bottom spacer is transferred to the first hardmask layer, as described above with respect to FIGS. 12A-12B. In step 1216, a tone inversion mask is formed between portions of the patterned second hardmask layer, as described above with respect to FIGS. 13A-14B.

In step 1218, the patterned second hardmask layer is removed, as described above with respect to FIGS. 15A-15B. In step 1220, the first hardmask layer is patterned using the tone inversion mask as an etching mask, as described above with respect to FIGS. 16A-16B. In step 1222, a subtractive etch is performed on the conductive layer using the patterned first hardmask layer as another etching mask, as described above with respect to FIGS. 17A-17B.

Example embodiments of the disclosure are described below. Other embodiments can also be understood from the entirety of the specification as well as the claims filed herein.

Example 1. A method for processing a substrate, the method including: forming a first hardmask layer over a target layer and a second hardmask layer over the first hardmask layer; patterning the second hardmask layer; forming a tone inversion mask between portions of the patterned second hardmask layer; removing the patterned second hardmask layer; patterning the first hardmask layer using the tone inversion mask as an etching mask; and etching the target layer using the patterned first hardmask layer as another etching mask.

Example 2. The method of example 1, where the target layer includes a metal.

Example 3. The method of example 2, further including, after etching the target layer, filling gaps formed through the target layer with a filling layer, the filling layer including a dielectric material.

Example 4. The method of one of examples 1 to 3, where the tone inversion mask includes titanium oxide, silicon oxide, or aluminum oxide.

Example 5. The method of one of examples 1 to 4, where the second hardmask layer includes a mask layer and a stop layer over the mask layer, the stop layer including a different material from the mask layer.

Example 6. The method of example 5, where the stop layer includes silicon nitride.

Example 7. The method of one of examples 5 or 6, where forming the tone inversion mask includes: forming a tone inversion coat over and between portions of the patterned second hardmask layer; and removing a top portion of the tone inversion coat with a chemical mechanical polish, where the stop layer stops the chemical mechanical polish.

Example 8. A method for processing a substrate, the method including: forming a mandrel over a target layer; forming a first cut mandrel and a second cut mandrel from the mandrel with a mandrel cut process; forming a spacer layer over the first cut mandrel and the second cut mandrel, the spacer layer filling a cut between the first cut mandrel and the second cut mandrel; etching the spacer layer, where remaining portions of the spacer layer form spacers; exposing a first hardmask layer by removing the first cut mandrel and the second cut mandrel, the first hardmask layer being over the target layer; transferring a first pattern of the spacers to the first hardmask layer; forming a tone inversion mask between portions of the patterned first hardmask layer; and transferring a second pattern of the tone inversion mask to the target layer with a subtractive etching process, where a tone of the second pattern is the reverse of a tone of the first pattern.

Example 9. The method of example 8, where the portion of the spacer layer between the first cut mandrel and the second cut mandrel includes a seam.

Example 10. The method of one of examples 8 or 9, where the mandrel includes amorphous silicon.

Example 11. The method of one of examples 8 to 10, where the spacer layer includes titanium oxide or titanium nitride.

Example 12. The method of one of examples 8 to 11, where the mandrel cut process includes: forming a patterned resist over the mandrel, where a trench through the patterned resist exposes a portion of the mandrel; and forming a cut through the mandrel with an etching process using the patterned resist as an etch mask.

Example 13. The method of one of examples 8 to 12, where forming the tone inversion mask includes: forming a tone inversion coat over and between portions of the patterned first hardmask layer; and removing a top portion of the tone inversion coat.

Example 14. The method of example 13, where portions of the spacers remain over the patterned first hardmask layer after forming the tone inversion coat.

Example 15. A method for processing a substrate, the method including: forming a first hardmask layer over a conductive layer and a second hardmask layer over the first hardmask layer; forming a first mandrel and a second mandrel over the second hardmask layer; forming a spacer layer over the first mandrel and the second mandrel; forming a non-mandrel block between the first mandrel and the second mandrel; performing an anisotropic etching technique on the spacer layer, where a first remaining portion of the spacer layer form spacers around sidewalls of the first mandrel and the second mandrel, and where a second remaining portion of the spacer layer under the non-mandrel block forms a bottom spacer; exposing the second hardmask layer by removing the first mandrel and the second mandrel; transferring a pattern of the spacers and the bottom spacer to the first hardmask layer; forming a tone inversion mask between portions of the patterned second hardmask layer; removing the patterned second hardmask layer; patterning the first hardmask layer using the tone inversion mask as an etching mask; and performing a subtractive etch on the conductive layer using the patterned first hardmask layer as another etching mask.

Example 16. The method of example 15, where forming the non-mandrel block includes: forming a lithography stack over the spacer layer; forming a patterned resist over the lithography stack; and patterning the lithography stack using the patterned resist as a mask.

Example 17. The method of one of examples 15 or 16, where the non-mandrel block includes spin-on carbon.

Example 18. The method of one of examples 15 to 16, where the bottom spacer has a smaller vertical thickness than a vertical thickness of the spacers.

Example 19. The method of one of examples 15 to 18, further including forming a cut through the first mandrel and the second mandrel.

Example 20. The method of example 19, where the spacer layer fills the cut through the first mandrel and the second mandrel.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:

forming a first hardmask layer over a target layer and a second hardmask layer over the first hardmask layer;

forming a first mandrel and a second mandrel over the second hardmask layer;

forming a spacer layer over the first mandrel and the second mandrel;

forming a non-mandrel block between the first mandrel and the second mandrel;

forming spacers around sidewalls of the first mandrel and the second mandrel from a first portion of the spacer layer;

forming a bottom spacer from a second portion of the spacer layer under the non-mandrel block;

removing the first mandrel and the second mandrel;

patterning the second hardmask layer by transferring a pattern of the spacers and the bottom spacer to the second hardmask layer;

forming a tone inversion mask between portions of the patterned second hardmask layer;

removing the patterned second hardmask layer;

patterning the first hardmask layer using the tone inversion mask as an etching mask; and etching the target layer using the patterned first hardmask layer as another etching mask.

2. The method of claim 1, wherein the target layer comprises a metal.

3. The method of claim 2, further comprising, after etching the target layer, filling gaps formed through the target layer with a filling layer, the filling layer comprising a dielectric material.

4. The method of claim 1, wherein the tone inversion mask comprises titanium oxide, silicon oxide, or aluminum oxide.

5. The method of claim 1, wherein the second hardmask layer comprises a mask layer and a stop layer over the mask layer, the stop layer comprising a different material from the mask layer.

6. The method of claim 5, wherein the stop layer comprises silicon nitride.

7. The method of claim 5, wherein forming the tone inversion mask comprises:

forming a tone inversion coat over and between portions of the patterned second hardmask layer; and removing a top portion of the tone inversion coat with a chemical mechanical polish, wherein the stop layer stops the chemical mechanical polish.

8. A method for processing a substrate, the method comprising:

forming a mandrel over a target layer;

forming a first cut mandrel and a second cut mandrel by bisecting the mandrel with a mandrel cut process;

forming a spacer layer over the first cut mandrel and the second cut mandrel, the spacer layer filling a cut between the first cut mandrel and the second cut mandrel;

etching the spacer layer, wherein remaining portions of the spacer layer form spacers;

exposing a first hardmask layer by removing the first cut mandrel and the second cut mandrel, the first hardmask layer being over the target layer;

transferring a first pattern of the spacers to the first hardmask layer;

forming a tone inversion mask between portions of the patterned first hardmask layer; and transferring a second pattern of the tone inversion mask to the target layer with a subtractive etching process, wherein a tone of the second pattern is the reverse of a tone of the first pattern.

9. The method of claim 8, wherein the portion of the spacer layer between the first cut mandrel and the second cut mandrel comprises a seam.

10. The method of claim 8, wherein the mandrel comprises amorphous silicon.

11. The method of claim 8, wherein the spacer layer comprises titanium oxide or titanium nitride.

12. The method of claim 8, wherein the mandrel cut process comprises:

forming a patterned resist over the mandrel, wherein a trench through the patterned resist exposes a portion of the mandrel; and forming a cut through the mandrel with an etching process using the patterned resist as an etch mask.

13. The method of claim 8, wherein forming the tone inversion mask comprises:

forming a tone inversion coat over and between portions of the patterned first hardmask layer; and removing a top portion of the tone inversion coat.

14. The method of claim 13, wherein portions of the spacers remain over the patterned first hardmask layer after forming the tone inversion coat.

15. A method for processing a substrate, the method comprising:

forming a first hardmask layer over a conductive layer and a second hardmask layer over the first hardmask layer;

forming a first mandrel and a second mandrel over the second hardmask layer;

forming a spacer layer over the first mandrel and the second mandrel;

forming a non-mandrel block between the first mandrel and the second mandrel;

performing an anisotropic etching technique on the spacer layer, wherein a first remaining portion of the spacer layer forms spacers around sidewalls of the first mandrel and the second mandrel, and wherein a second remaining portion of the spacer layer under the non-mandrel block forms a bottom spacer;

exposing the second hardmask layer by removing the first mandrel and the second mandrel;

transferring a pattern of the spacers and the bottom spacer to the second hardmask layer;

forming a tone inversion mask between portions of the patterned second hardmask layer;

removing the patterned second hardmask layer;

patterning the first hardmask layer using the tone inversion mask as an etching mask; and performing a subtractive etch on the conductive layer using the patterned first hardmask layer as another etching mask.

16. The method of claim 15, wherein forming the non-mandrel block comprises:

forming a lithography stack over the spacer layer;

forming a patterned resist over the lithography stack; and patterning the lithography stack using the patterned resist as a mask.

17. The method of claim 15, wherein the non-mandrel block comprises spin-on carbon.

18. The method of claim 15, wherein the bottom spacer has a smaller vertical thickness than a vertical thickness of the spacers.

19. The method of claim 15, further comprising forming a cut through the first mandrel and the second mandrel.

20. The method of claim 19, wherein the spacer layer fills the cut through the first mandrel and the second mandrel.

* * * * *